(12) United States Patent
Jayaraman et al.

(10) Patent No.: US 7,906,941 B2
(45) Date of Patent: *Mar. 15, 2011

(54) SYSTEM AND METHOD FOR ESTIMATING INPUT POWER FOR A POWER PROCESSING CIRCUIT

(75) Inventors: Chandrasekaran Jayaraman, Karnataka (IN); Prashant Gugle, Karnataka (IN)

(73) Assignee: Flextronics International USA, Inc., San Jose, CA (US)

( * ) Notice: Subject to any disclaimer, the term of this patent is extended or adjusted under 35 U.S.C. 154(b) by 277 days.

This patent is subject to a terminal disclaimer.

(21) Appl. No.: 11/955,642

(22) Filed: Dec. 13, 2007

(65) Prior Publication Data

US 2008/0315852 A1 Dec. 25, 2008

Related U.S. Application Data

(60) Provisional application No. 60/945,024, filed on Jun. 19, 2007.

(51) Int. Cl.
*G05F 1/613* (2006.01)
*G05F 1/70* (2006.01)

(52) U.S. Cl. .......................... 323/222; 323/283; 363/89

(58) Field of Classification Search .................. 323/222, 323/283, 285; 363/89
See application file for complete search history.

(56) References Cited

U.S. PATENT DOCUMENTS

| | | | |
|---|---|---|---|
| 1,376,978 A | 5/1921 | Stoekle | |
| 3,346,798 A | 10/1967 | Dinger | |
| 3,358,210 A | 12/1967 | Grossoehme | |
| 3,433,998 A | 3/1969 | Woelber | |
| 3,484,562 A | 12/1969 | Kronfeld | |
| 3,553,620 A | 1/1971 | Cielo et al. | |
| 3,622,868 A | 11/1971 | Todt | |
| 3,681,679 A | 8/1972 | Chung | |
| 3,708,744 A | 1/1973 | Stephens et al. | |
| 4,019,122 A | 4/1977 | Ryan | |

(Continued)

FOREIGN PATENT DOCUMENTS

EP  0 665 634 A1  1/1994

(Continued)

OTHER PUBLICATIONS

Freescale Semiconductor. "Implementing a Digital AC/DC Switched-Mode Power Supply using a 56F8300 Digital Signal Controller". Application Note AN3115. Aug. 2005.*

(Continued)

*Primary Examiner* — Jeffrey L Sterrett
*Assistant Examiner* — Fred E Finch, III
(74) *Attorney, Agent, or Firm* — Slater & Matsil, L.L.P.

(57) ABSTRACT

A controller for a power processing circuit and a related method of operating the same. In one embodiment, the controller includes a multiplier configured to produce a product of an input current and an input voltage of the power processing circuit. The controller also includes a low-pass filter configured to produce an input power estimate of an input power to the power processing circuit as a function of the product of the input current and the input voltage. In another embodiment, the controller is a power-factor controller and includes a voltage loop compensator configured to produce a voltage compensation signal as a function of an output voltage of the power processing circuit. The controller also includes an input power estimator configured to produce an input power estimate of an input power to the power processing circuit as a function of the voltage compensation signal.

20 Claims, 8 Drawing Sheets

U.S. PATENT DOCUMENTS

| | | |
|---|---|---|
| 4,075,547 A | 2/1978 | Wroblewski |
| 4,327,348 A | 4/1982 | Hirayama |
| 4,471,423 A | 9/1984 | Hase |
| 4,499,481 A | 2/1985 | Greene |
| 4,570,174 A | 2/1986 | Huang et al. |
| 4,577,268 A | 3/1986 | Easter et al. |
| 4,581,691 A | 4/1986 | Hock |
| 4,636,823 A | 1/1987 | Margalit et al. |
| 4,660,136 A | 4/1987 | Montorefano |
| 4,770,667 A | 9/1988 | Evans et al. |
| 4,770,668 A | 9/1988 | Skoultchi et al. |
| 4,785,387 A | 11/1988 | Lee et al. |
| 4,803,609 A | 2/1989 | Gillett et al. |
| 4,823,249 A | 4/1989 | Garcia, II |
| 4,866,367 A | 9/1989 | Ridley et al. |
| 4,887,061 A | 12/1989 | Matsumura |
| 4,899,271 A | 2/1990 | Seiersen |
| 4,903,089 A | 2/1990 | Hollis et al. |
| 4,922,400 A | 5/1990 | Cook |
| 4,964,028 A | 10/1990 | Spataro |
| 4,999,759 A | 3/1991 | Cavagnolo et al. |
| 5,003,277 A | 3/1991 | Sokai et al. |
| 5,027,264 A | 6/1991 | DeDoncker et al. |
| 5,068,756 A | 11/1991 | Morris et al. |
| 5,106,778 A | 4/1992 | Hollis et al. |
| 5,126,714 A | 6/1992 | Johnson |
| 5,132,888 A | 7/1992 | Lo et al. |
| 5,134,771 A | 8/1992 | Lee et al. |
| 5,172,309 A | 12/1992 | DeDoncker et al. |
| 5,177,460 A | 1/1993 | Dhyanchand et al. |
| 5,182,535 A | 1/1993 | Dhyanchand |
| 5,204,809 A | 4/1993 | Andresen |
| 5,206,621 A | 4/1993 | Yerman |
| 5,208,739 A | 5/1993 | Sturgeon |
| 5,223,449 A | 6/1993 | Morris et al. |
| 5,231,037 A | 7/1993 | Yuan et al. |
| 5,244,829 A | 9/1993 | Kim |
| 5,262,930 A | 11/1993 | Hua et al. |
| 5,291,382 A | 3/1994 | Cohen |
| 5,303,138 A | 4/1994 | Rozman |
| 5,305,191 A | 4/1994 | Loftus, Jr. |
| 5,335,163 A | 8/1994 | Seiersen |
| 5,336,985 A | 8/1994 | McKenzie |
| 5,342,795 A | 8/1994 | Yuan et al. |
| 5,343,140 A | 8/1994 | Gegner |
| 5,353,001 A | 10/1994 | Meinel et al. |
| 5,369,042 A | 11/1994 | Morris et al. |
| 5,374,887 A | 12/1994 | Drobnik |
| 5,399,968 A | 3/1995 | Sheppard et al. |
| 5,407,842 A | 4/1995 | Morris et al. |
| 5,468,661 A | 11/1995 | Yuan et al. |
| 5,508,903 A | 4/1996 | Alexndrov |
| 5,554,561 A | 9/1996 | Plumton |
| 5,555,494 A | 9/1996 | Morris |
| 5,610,085 A | 3/1997 | Yuan et al. |
| 5,624,860 A | 4/1997 | Plumton et al. |
| 5,663,876 A | 9/1997 | Newton et al. |
| 5,700,703 A | 12/1997 | Huang et al. |
| 5,712,189 A | 1/1998 | Plumton et al. |
| 5,719,544 A | 2/1998 | Vinciarelli et al. |
| 5,734,564 A | 3/1998 | Brkovic |
| 5,736,842 A | 4/1998 | Jovanovic |
| 5,742,491 A | 4/1998 | Bowman et al. |
| 5,747,842 A | 5/1998 | Plumton |
| 5,756,375 A | 5/1998 | Celii et al. |
| 5,760,671 A | 6/1998 | Lahr et al. |
| 5,783,984 A | 7/1998 | Keuneke |
| 5,784,266 A | 7/1998 | Chen |
| 5,804,943 A | 9/1998 | Kollman et al. |
| 5,815,386 A | 9/1998 | Gordon |
| 5,864,110 A * | 1/1999 | Moriguchi et al. ...... 219/121.57 |
| 5,870,299 A | 2/1999 | Rozman |
| 5,886,508 A | 3/1999 | Jutras |
| 5,889,298 A | 3/1999 | Plumton et al. |
| 5,889,660 A | 3/1999 | Taranowski et al. |
| 5,900,822 A * | 5/1999 | Sand et al. ................. 340/648 |
| 5,909,110 A | 6/1999 | Yuan et al. |
| 5,910,665 A | 6/1999 | Plumton et al. |
| 5,920,475 A | 7/1999 | Boylan et al. |
| 5,925,088 A | 7/1999 | Nasu |
| 5,933,338 A | 8/1999 | Wallace |
| 5,940,287 A | 8/1999 | Brkovic |
| 5,956,245 A | 9/1999 | Rozman |
| 5,956,578 A | 9/1999 | Weitzel et al. |
| 5,977,853 A | 11/1999 | Ooi et al. |
| 5,999,066 A | 12/1999 | Saito et al. |
| 6,003,139 A * | 12/1999 | McKenzie ................... 713/300 |
| 6,008,519 A | 12/1999 | Yuan et al. |
| 6,011,703 A | 1/2000 | Boylan et al. |
| 6,038,154 A | 3/2000 | Boylan et al. |
| 6,060,943 A | 5/2000 | Jansen |
| 6,067,237 A | 5/2000 | Nguyen |
| 6,069,799 A | 5/2000 | Bowman et al. |
| 6,078,510 A | 6/2000 | Spampinato et al. |
| 6,084,792 A | 7/2000 | Chen et al. |
| 6,094,038 A | 7/2000 | Lethellier |
| 6,097,046 A | 8/2000 | Plumton |
| 6,144,187 A * | 11/2000 | Bryson ......................... 320/137 |
| 6,147,886 A | 11/2000 | Wittenbreder |
| 6,156,611 A | 12/2000 | Lan et al. |
| 6,163,466 A | 12/2000 | Davila, Jr. et al. |
| 6,181,231 B1 | 1/2001 | Bartilson |
| 6,188,586 B1 | 2/2001 | Farrington et al. |
| 6,191,964 B1 | 2/2001 | Boylan et al. |
| 6,208,535 B1 | 3/2001 | Parks |
| 6,215,290 B1 | 4/2001 | Yang et al. |
| 6,218,891 B1 | 4/2001 | Lotfi et al. |
| 6,229,197 B1 | 5/2001 | Plumton et al. |
| 6,262,564 B1 | 7/2001 | Kanamori |
| 6,288,920 B1 | 9/2001 | Jacobs et al. |
| 6,309,918 B1 | 10/2001 | Huang et al. |
| 6,320,490 B1 | 11/2001 | Clayton |
| 6,323,090 B1 | 11/2001 | Zommer |
| 6,348,848 B1 | 2/2002 | Herbert |
| 6,351,396 B1 | 2/2002 | Jacobs |
| 6,356,462 B1 | 3/2002 | Jang et al. |
| 6,362,986 B1 | 3/2002 | Schultz et al. |
| 6,373,734 B1 * | 4/2002 | Martinelli ..................... 363/89 |
| 6,380,836 B2 | 4/2002 | Matsumoto et al. |
| 6,388,898 B1 | 5/2002 | Fan et al. |
| 6,392,902 B1 | 5/2002 | Jang et al. |
| 6,414,578 B1 | 7/2002 | Jitaru |
| 6,462,965 B1 | 10/2002 | Uesono |
| 6,469,564 B1 | 10/2002 | Jansen |
| 6,477,065 B2 | 11/2002 | Parks |
| 6,483,724 B1 | 11/2002 | Blair et al. |
| 6,489,754 B2 | 12/2002 | Blom |
| 6,498,367 B1 | 12/2002 | Chang et al. |
| 6,501,193 B1 | 12/2002 | Krugly |
| 6,504,321 B2 * | 1/2003 | Giannopoulos et al. ...... 315/291 |
| 6,512,352 B2 | 1/2003 | Qian |
| 6,525,603 B1 | 2/2003 | Morgan |
| 6,539,299 B2 | 3/2003 | Chatfield et al. |
| 6,545,453 B2 | 4/2003 | Glinkowski et al. |
| 6,549,436 B1 | 4/2003 | Sun |
| 6,661,276 B1 | 12/2003 | Chang |
| 6,683,797 B2 | 1/2004 | Zaitsu et al. |
| 6,696,910 B2 | 2/2004 | Nuytkens et al. |
| 6,731,486 B2 | 5/2004 | Holt et al. |
| 6,741,099 B1 | 5/2004 | Krugly |
| 6,753,723 B2 | 6/2004 | Zhang |
| 6,765,810 B2 | 7/2004 | Perry |
| 6,775,159 B2 | 8/2004 | Webb et al. |
| 6,784,644 B2 | 8/2004 | Xu et al. |
| 6,831,847 B2 | 12/2004 | Perry |
| 6,862,194 B2 | 3/2005 | Yang et al. |
| 6,867,678 B2 | 3/2005 | Yang |
| 6,873,237 B2 | 3/2005 | Chandrasekaran et al. |
| 6,944,033 B1 | 9/2005 | Xu et al. |
| 6,977,824 B1 | 12/2005 | Yang et al. |
| 6,980,077 B1 | 12/2005 | Chandrasekaran et al. |
| 6,982,887 B2 | 1/2006 | Batarseh et al. |
| 7,009,486 B1 | 3/2006 | Goeke et al. |
| 7,012,414 B1 | 3/2006 | Mehrotra et al. |
| 7,016,204 B2 | 3/2006 | Yang et al. |
| 7,034,586 B2 | 4/2006 | Mehas et al. |
| 7,034,647 B2 | 4/2006 | Yan et al. |

| | | |
|---|---|---|
| 7,046,523 B2 | 5/2006 | Sun et al. |
| 7,061,358 B1 | 6/2006 | Yang |
| 7,076,360 B1 | 7/2006 | Ma |
| 7,148,669 B2 * | 12/2006 | Maksimovic et al. ........ 323/283 |
| 7,170,268 B2 | 1/2007 | Kim |
| 7,176,662 B2 | 2/2007 | Chandrasekaran |
| 7,280,026 B2 | 10/2007 | Chandrasekaran et al. |
| 7,285,807 B2 | 10/2007 | Brar et al. |
| 7,298,118 B2 | 11/2007 | Chandrasekaran |
| 7,321,283 B2 | 1/2008 | Mehrotra et al. |
| 7,332,992 B2 | 2/2008 | Iwai |
| 7,339,208 B2 | 3/2008 | Brar et al. |
| 7,362,592 B2 | 4/2008 | Yang et al. |
| 7,362,593 B2 | 4/2008 | Yang et al. |
| 7,385,375 B2 | 6/2008 | Rozman |
| 7,417,875 B2 | 8/2008 | Chandrasekaran et al. |
| 7,427,910 B2 | 9/2008 | Mehrotra et al. |
| 7,468,649 B2 | 12/2008 | Chandrasekaran |
| 7,489,225 B2 | 2/2009 | Dadafshar |
| 7,554,430 B2 | 6/2009 | Mehrotra et al. |
| 7,633,369 B2 | 12/2009 | Chandrasekaran et al. |
| 7,663,183 B2 | 2/2010 | Brar et al. |
| 7,675,758 B2 | 3/2010 | Artusi et al. |
| 7,675,759 B2 | 3/2010 | Artusi et al. |
| 2002/0114172 A1 | 8/2002 | Webb et al. |
| 2003/0197585 A1 | 10/2003 | Chandrasekaran et al. |
| 2003/0198067 A1 | 10/2003 | Sun et al. |
| 2004/0017689 A1 | 1/2004 | Zhang et al. |
| 2004/0034555 A1 | 2/2004 | Dismukes et al. |
| 2004/0148047 A1 | 7/2004 | Dismukes et al. |
| 2004/0156220 A1 | 8/2004 | Kim et al. |
| 2005/0024179 A1 | 2/2005 | Chandrasekaran et al. |
| 2005/0245658 A1 | 11/2005 | Mehrotra et al. |
| 2005/0281058 A1 | 12/2005 | Batarseh et al. |
| 2006/0006976 A1 | 1/2006 | Bruno |
| 2006/0038549 A1 | 2/2006 | Mehrotra et al. |
| 2006/0038649 A1 | 2/2006 | Mehrotra et al. |
| 2006/0038650 A1 | 2/2006 | Mehrotra et al. |
| 2006/0109698 A1 | 5/2006 | Qu |
| 2006/0187684 A1 | 8/2006 | Chandrasekaran et al. |
| 2006/0197510 A1 | 9/2006 | Chandrasekaran |
| 2006/0198173 A1 | 9/2006 | Rozman |
| 2006/0226477 A1 | 10/2006 | Brar et al. |
| 2006/0226478 A1 | 10/2006 | Brar et al. |
| 2006/0237968 A1 | 10/2006 | Chandrasekaran |
| 2006/0255360 A1 | 11/2006 | Brar et al. |
| 2007/0007945 A1 * | 1/2007 | King et al. .................... 324/142 |
| 2007/0045765 A1 | 3/2007 | Brar et al. |
| 2007/0069286 A1 | 3/2007 | Brar et al. |
| 2007/0114979 A1 | 5/2007 | Chandrasekaran |
| 2007/0159857 A1 | 7/2007 | Lee |
| 2007/0222463 A1 | 9/2007 | Qahouq et al. |
| 2007/0296028 A1 | 12/2007 | Brar et al. |
| 2007/0298559 A1 | 12/2007 | Brar et al. |
| 2007/0298564 A1 | 12/2007 | Brar et al. |
| 2008/0024259 A1 | 1/2008 | Chandrasekaran et al. |
| 2008/0054874 A1 | 3/2008 | Chandrasekaran et al. |
| 2008/0111657 A1 | 5/2008 | Mehrotra et al. |
| 2008/0130321 A1 | 6/2008 | Artusi et al. |
| 2008/0130322 A1 | 6/2008 | Artusi et al. |
| 2008/0150666 A1 | 6/2008 | Chandrasekaran et al. |
| 2008/0224812 A1 | 9/2008 | Chandrasekaran |
| 2008/0232141 A1 | 9/2008 | Artusi et al. |
| 2008/0316779 A1 | 12/2008 | Jayaraman et al. |
| 2010/0091522 A1 | 4/2010 | Chandrasekaran et al. |
| 2010/0182806 A1 | 7/2010 | Garrity et al. |
| 2010/0188876 A1 | 7/2010 | Garrity et al. |

FOREIGN PATENT DOCUMENTS

| | | |
|---|---|---|
| JP | 3-215911 | 9/1991 |
| JP | 2000-68132 | 3/2000 |
| WO | WO 2010/083511 A1 | 7/2010 |
| WO | WO 2010/083514 A1 | 7/2010 |

OTHER PUBLICATIONS

Ajram, S., et al., "Ultrahigh Frequency DC-to-DC Converters Using GaAs Power Switches," IEEE Transactions on Power Electronics, Sep. 2001, pp. 594-602, vol. 16, No. 5, IEEE, Los Alamitos, CA.

"AN100: Application Note using Lx100 Family of High Performance N-Ch JFET Transistors," AN100.Rev 1.01, Sep. 2003, 5 pp., Lovoltech, Inc., Santa Clara, CA.

"AN101A: Gate Drive Network for a Power JFET," AN101A.Rev 1.2, Nov. 2003, 2 pp., Lovoltech, Inc., Santa Clara, CA.

"AN108: Applications Note: How to Use Power JFETs® and MOSFETs Interchangeably in Low-Side Applications," Rev. 1.0.1, Feb. 14, 2005, 4 pp., Lovoltech, Inc., Santa Clara, CA.

Balogh, L., et al., "Power-Factor Correction with Interleaved Boost Converters in Continuous-Inductor-Current Mode," IEEE Proceedings of APEC, pp. 168-174, 1993, IEEE, Los Alamitos, CA.

Biernacki, J., et al., "Radio Frequency DC-DC Flyback Converter," Proceedings of the 43rd IEEE Midwest Symposium on Circuits and Systems, Aug. 8-11, 2000, pp. 94-97, vol. 1, IEEE, Los Alamitos, CA.

Chen, W., et al., "Design of High Efficiency, Low Profile, Low Voltage Converter with Integrated Magnetics," Proceedings of 1997 IEEE Applied Power Electronics Conference (APEC '97), 1997, pp. 911-917, IEEE, Los Alamitos, CA.

Curtis, K., "Advances in Microcontroller Peripherals Facilitate Current-Mode for Digital Power Supplies," Digital Power Forum '06, 4 pp., Sep. 2006, Darnell Group, Richardson, TX.

Eisenbeiser, K., et al., "Manufacturable GaAs VFET for Power Switching Applications," IEEE Electron Device Letters, Apr. 2000, pp. 144-145, vol. 21, No. 4, IEEE.

Gaye, M., et al., "A 50-100MHz 5V to -5V, 1W Cuk Converter Using Gallium Arsenide Power Switches," ISCAS 2000—IEEE International Symposium on Circuits and Systems, May 28-31, 2000, pp. I-264-I-267, vol. 1, IEEE, Geneva, Switzerland.

Goldberg, A.F., et al., "Issues Related to 1-10-MHz Transformer Design," IEEE Transactions on Power Electronics, Jan. 1989, pp. 113-123, vol. 4, No. 1, IEEE, Los Alamitos, CA.

Goldberg, A.F., et al., "Finite-Element Analysis of Copper Loss in 1-10-MHz Transformers," IEEE Transactions on Power Electronics, Apr. 1989, pp. 157-167, vol. 4, No. 2, IEEE, Los Alamitos, CA.

Jitaru, I.D., et al., "Quasi-Integrated Magnetic An Avenue for Higher Power Density and Efficiency in Power Converters," Twelfth Annual Applied Power Electronics Conference and Exposition, Feb. 23-27, 1997, pp. 395-402, vol. 1, IEEE, Los Alamitos, CA.

Kollman, R., et al., "10 MHz PWM Converters with GaAs VFETs," IEEE Eleventh Annual Applied Power Electronics Conference and Exposition, Mar. 1996, pp. 264-269, vol. 1, IEEE.

Lee, P.-W., et al., "Steady-State Analysis of an Interleaved Boost Converter with Coupled Inductors," IEEE Transactions on Industrial Electronics, Aug. 2000, pp. 787-795, vol. 47, No. 4, IEEE, Los Alamitos, CA.

Lenk, R., "Introduction to the Tapped Buck Converter," PCIM 2000, HFPC 2000 Proceedings, Oct. 2000, pp. 155-166.

Liu, W., "Fundamentals of III-V Devices: HBTs, MESFETs, and HFETs/HEMTs," §5-5: Modulation Doping, 1999, pp. 323-330, John Wiley & Sons, New York, NY.

Maksimović, D., et al., "Switching Converters with Wide DC Conversion Range," IEEE Transactions on Power Electronics, Jan. 1991, pp. 151-157, vol. 6, No. 1, IEEE, Los Alamitos, CA.

Middlebrook, R.D., "Transformerless DC-to-DC Converters with Large Conversion Ratios," IEEE Transactions on Power Electronics, Oct. 1988, pp. 484-488, vol. 3, No. 4, IEEE, Los Alamitos, CA.

Miwa, B.A., et al., "High Efficiency Power Factor Correction Using Interleaving Techniques," IEEE Proceedings of APEC, 1992, pp. 557-568, IEEE, Los Alamitos, CA.

Nguyen, L.D., et al., "Ultra-High-Speed Modulation-Doped Field-Effect Transistors: A Tutorial Review," Proceedings of the IEEE, Apr. 1992, pp. 494-518, vol. 80, No. 4, IEEE.

Niemela, V.A., et al., "Comparison of GaAs and Silicon Synchronous Rectifiers in a 3.3V Out, 50W DC-DC Converter," 27th Annual, IEEE Power Electronics Specialists Conference, Jun. 1996, pp. 861-867, vol. 1, IEEE.

Ninomiya, T., et al., "Static and Dynamic Analysis of Zero-Voltage-Switched Half-Bridge Converter with PWM Control," Proceedings of 1991 IEEE Power Electronics Specialists Conference (PESC '91), 1991, pp. 230-237, IEEE, Los Alamitos, CA.

O'Meara, K., "A New Output Rectifier Configuration Optimized for High Frequency Operation," Proceedings of 1991 High Frequency Power Conversion (HFPC '91) Conference, Jun. 1991, pp. 219-225, Toronto, CA.

Peng, C., et al., "A New Efficient High Frequency Rectifier Circuit," Proceedings of 1991 High Frequency Power Conversion (HFPC '91) Conference, Jun. 1991, pp. 236-243, Toronto, CA.

Pietkiewicz, A., et al. "Coupled-Inductor Current-Doubler Topololgy in Phase-Shifted Full-Bridge DC-DC Converter," Proceeding of INTELEC '98, 1998, 9 pp., Paper 2-3, IEEE, Los Alamitos, CA.

Plumton, D.L., et al., "A Low On-Resistance High-Current GaAs Power VFET," IEEE Electron Device Letters, Apr. 1995, pp. 142-144, vol. 16, No. 4, IEEE.

Rajeev, M., "An Input Current Shaper with Boost and Flyback Converter Using Integrated Magnetics," Power Electronics and Drive Systems, Fifth International Conference on Power Electronics and Drive Systems 2003, Nov. 17-20, 2003, pp. 327-331, vol. 1, IEEE, Los Alamitos, CA.

Rico, M., et al., "Static and Dynamic Modeling of Tapped-Inductor DC-to-DC Converters," 1987, pp. 281-288, IEEE, Los Alamitos, CA.

Severns, R., "Circuit Reinvention in Power Electronics and Identification of Prior Work," Proceedings of 1997 IEEE Applied Power Electronics Conference (APEC '97), 1997, pp. 3-9, IEEE, Los Alamitos, CA.

Severns, R., "Circuit Reinvention in Power Electronics and Identification of Prior Work," IEEE Transactions on Power Electronics, Jan. 2001, pp. 1-7, vol. 16, No. 1, IEEE, Los Alamitos, CA.

Sun, J., et al., "Unified Analysis of Half-Bridge Converters with Current-Doubler Rectifier," Proceedings of 2001 IEEE Applied Power Electronics Conference, 2001, pp. 514-520, IEEE, Los Alamitos, CA.

Thaker, M., et al., "Adaptive/Intelligent Control and Power Management Reduce Power Dissipation and Consumption," Digital Power Forum '06, 11 pp., Sep. 2006, Darnell Group, Richardson, TX.

Wei, J., et al.,"Comparison of Three Topology Candidates for 12V VRM" IEEE APEC, 2001, pp. 245-251, IEEE, Los Alamitos, CA.

Weitzel, C.E., "RF Power Devices for Wireless Communications," 2002 IEEE MTT-S CDROM, 2002, pp. 285-288, paper TU4B-1, IEEE, Los Alamitos, CA.

Williams, R., "Modern GaAs Processing Methods," 1990, pp. 66-67, Artech House, Inc., Norwood, MA.

Xu, P., et al., "Design and Performance Evaluation of Multi-Channel Interleaved Quasi-Square-Wave Buck Voltage Regulator Module," HFPC 2000 Proceedings, Oct. 2000, pp. 82-88.

Xu, P., et al., "Design of 48 V Voltage Regulator Modules with a Novel Integrated Magnetics," IEEE Transactions on Power Electronics, Nov. 2002, pp. 990-998, vol. 17, No. 6, IEEE, Los Alamitos, CA.

Xu, P., et al., "A Family of Novel Interleaved DC/DC Converters for Low-Voltage High-Current Voltage Regulator Module Applications," IEEE Power Electronics Specialists Conference, Jun. 2001, pp. 1507-1511, IEEE, Los Alamitos, CA.

Xu, P., et al., "A Novel Integrated Current Doubler Rectifier," IEEE 2000 Applied Power Electronics Conference, Mar. 2000, pp. 735-740, IEEE, Los Alamitos, CA.

Zhou, X., et al., "A High Power Density, High Efficiency and Fast Transient Voltage Regulator Module with a Novel Current Sensing and Current Sharing Technique," IEEE Applied Power Electronics Conference, Mar. 1999, pp. 289-294, IEEE, Los Alamitos, CA.

Zhou, X., et al., "Investigation of Candidate VRM Topologies for Future Microprocessors," IEEE Applied Power Electronics Conference, Mar. 1998, pp. 145-150, IEEE, Los Alamitos, CA.

Chen, W., et al., "Integrated Planar Inductor Scheme for Multi-module Interleaved Quasi-Square-Wave (QSW) DC/DC Converter," 30th Annual IEEE Power Electronics Specialists Conference (PESC '99), 1999, pp. 759-762, vol. 2, IEEE, Los Alamitos, CA.

Wong, P.-L., et al., "Investigating Coupling Inductors in the Interleaving QSW VRM," 15th Annual Applied Power Electronics Conference and Exposition (APEC 2000), Feb. 2000, pp. 973-978, vol. 2, IEEE, Los Alamitos, CA.

Chhawchharia, P., et al., "On the Reduction of Component Count in Switched Capacitor DC/DC Convertors," Hong Kong Polytechnic University, IEEE, 1997, Hung Hom, Kowloon, Hong King, pp. 1395-1401.

Kuwabara, K., et al., "Switched-Capacitor DC—DC Converters," Fujitsu Limited, IEEE, 1988, Kawasaki, Japan, pp. 213-218.

Maxim, Application Note 725, www.maxim-ic.com/an725, Maxim Integrated Products, Nov. 29, 2001, 8 pages.

National Semiconductor Corporation, "LMC7660 Switched Capacitor Voltage Converter," www.national.com, Apr. 1997, 12 pages National Semiconductor Corporation, "LM2665 Switched Capacitor Voltage Converter," www.national.com, Sep. 2005, 9 pages.

Sun, J., et al., "An Improved Current-Doubler Rectifier with Integrated Magnetics," 17th Annual Applied Power Electronics Conference and Exposition (APEC), 2002, pp. 831-837, vol. 2, IEEE, Dallas, TX.

Texas Instruments Incorporated, "LT1054, LT1054Y Switched-Capacitor Voltage Converters With Regulators," SLVS033C, Feb. 1990—Revised Jul. 1998, 25 pages.

Vallamkonda, S., "Limitations of Switching Voltage Regulators," A Thesis in Electrical Engineering, Texas Tech University, May 2004, 89 pages.

Xu, M., et al., "Voltage Divider and its Application in the Two-stage Power Architecture," Center for Power Electronics Systems, Virginia Polytechnic Institute and State University, IEEE, 2006, Blacksburg, Virginia, pp. 499-505.

Yan, L., et al., "Integrated Magnetic Full Wave Converter with Flexible Output Inductor," 17th Annual Applied Power Electronics Conference and Exposition (APEC), 2002, pp. 824-830, vol. 2, IEEE, Dallas, TX.

Yan, L., et al., "Integrated Magnetic Full Wave Converter with Flexible Output Power Inductor," IEEE Transactions on Power Electronics, Mar. 2003, pp. 670-678, vol. 18, No. 2, IEEE, Los Alamitos, CA.

Chhawchharia, P., et al., "On the Reduction of Component Count in Switched Capacitor DC/DC Convertors," Hong Kong Polytechnic University, IEEE, 1997, Hung Hom, Kowloon, Hong King, pp. 1395-1401.

Kuwabara, K., et al., "Switched-Capacitor DC-DC Converters," Fujitsu Limited, IEEE, 1988, Kawasaki, Japan, pp. 213-218.

Maxim, Application Note 725, www.maxim-ic.com/an725, Maxim Integrated Products, Nov. 29, 2001, 8 pages.

National Semiconductor Corporation, "LMC7660 Switched Capacitor Voltage Converter," www.national.com, Apr. 1997, 12 pages.

National Semiconductor Corporation, "LM2665 Switched Capacitor Voltage Converter," www.national.com, Sep. 2005, 9 pages.

Sun, J., et al., "An Improved Current-Doubler Rectifier with Integrated Magnetics," 17th Annual Applied Power Electronics Conference and Exposition (APEC), 2002, pp. 831-837, vol. 2, IEEE, Dallas, TX.

Texas Instruments Incorporated, "LT1054, LT1054Y Switched-Capacitor Voltage Converters With Regulators," SLVS033C, Feb. 1990—Revised Jul. 1998, 25 pages.

Vallamkonda, S., "Limitations of Switching Voltage Regulators," A Thesis in Electrical Engineering, Texas Tech University, May 2004, 89 pages.

Xu, M., et al., "Voltage Divider and its Application in the Two-stage Power Architecture," Center for Power Electronics Systems, Virginia Polytechnic Institute and State University, IEEE, 2006, Blacksburg, Virginia, pp. 499-505.

Yan, L., et al., "Integrated Magnetic Full Wave Converter with Flexible Output Inductor," 17th Annual Applied Power Electronics Conference and Exposition (APEC), 2002, pp. 824-830, vol. 2, IEEE, Dallas, TX.

Yan, L., et al., "Integrated Magnetic Full Wave Converter with Flexible Output Inductor," IEEE Transactions on Power Electronics, Mar. 2003, pp. 670-678, vol. 18, No. 2, IEEE, Los Alamitos, CA.

Freescale Semiconductor, "Implementing a Digital AC/DC Switched-Mode Power Supply using a 56F8300 Digital Signal Controller," Application Note AN3115, Aug. 2005, 24 pp., Chandler, AZ.

Freescale Semiconductor, "56F8323 Evaluation Module User Manual, 56F8300 16-bit Digital Signal Controllers", MC56F8323EVMUM, Rev. 2, Jul. 2005 (72 pages).

Freescale Semiconductor, "56F8323/56F8123 Data Sheet Preliminary Technical Data, 56F8300 16-bit Digital Signal Controllers," MC56F8323 Rev. 17, Apr. 2007 (140 pages).

Freescale Semiconductor, "Design of a Digital AC/DC SMPS using the 56F8323 Device, Designer Reference Manual, 56800E 16-bit Digital Signal Controllers", DRM074, Rev. 0, Aug. 2005 (108 pages).

* cited by examiner

SYSTEM AND METHOD FOR ESTIMATING INPUT POWER FOR A POWER PROCESSING CIRCUIT

This application claims the benefit of U.S. Provisional Application No. 60/945,024, entitled "System and Method for Estimating Input Power by Filtering an Instantaneous Voltage-Current Product," filed on Jun. 19, 2007, which is incorporated herein by reference.

TECHNICAL FIELD

The present invention is directed, in general, to electronic power conversion and, more specifically, to a controller adapted to estimate an average input power to a power processing circuit, and method of operating the same.

BACKGROUND

A switch-mode power converter (also referred to as a "power converter") is a power supply or power processing circuit that converts an input voltage waveform, such as an ac input voltage waveform, into a specified output voltage waveform, such as a dc output voltage waveform. Controllers associated with the power converters manage an operation thereof by controlling the conduction periods of power switches employed therein. Generally, the controllers are coupled between an input and output of the power converter in a feedback loop configuration.

Typically, the controller measures an internal operating characteristic (e.g., an internal bus voltage) or an output characteristic, (e.g., an output voltage or an output current) representing an operating condition of the power converter, and based thereon modifies a duty cycle of a power switch or power switches of the power converter to regulate an internal operating characteristic or the output characteristic. The duty cycle is a ratio represented by a conduction period of a power switch to a switching period thereof. Thus, if a power switch conducts for half of the switching period, the duty cycle for the power switch would be 0.5 (or 50 percent). Additionally, as the needs for systems such as a microprocessor powered by the power converter dynamically change (e.g., as a computational load on the microprocessor changes), the controller should be configured to dynamically increase or decrease the duty cycle of the power switches therein to regulate the internal or the output characteristic at a desired value. In an exemplary application, the power converters have the capability to convert an unregulated ac input voltage, such as a nominal 240 volts ac, to a regulated, dc output voltage such as 400 volts, to power a load, which may include a further stage of power conversion, such as a dc-to-dc converter.

A new consideration for the design of a power converter in certain applications is the need for the power converter to estimate accurately an input power thereto averaged over a period of the input waveform, with an accuracy of, for instance, a few percent. The power converter may communicate the input power estimate to a system external to the power converter. Hence, there is a need to incorporate such input power estimation capability into a power converter.

The need to estimate accurately an input power to a power converter is a parallel need to the general objective to reduce energy consumed by an electronic system Power converter designers in the past have inadequately responded to this new design requirement. A particular technique that has been used to estimate input power averaged over an input voltage waveform includes sensing instantaneous input current and voltage to the power converter and forming an integral over a cycle of the input voltage waveform of a product of the instantaneous input current and voltage. This approach can entail a substantial amount of added signal processing, particularly when implemented with digital circuit elements.

The allocation of a digital resource in a high-performance, cost competitive application may be made on a priority basis in view of the basic control needs of the power converter, and may reluctantly be used as an auxiliary computation-intensive task such as estimation of power converter input power by integrating a product of waveforms. Producing an accurate estimate of input power to a power converter, particularly in a digital control application, without consuming valuable additional computing resources can have immediate effects on the applicability and marketplace acceptance of a particular power converter design.

A controller for a power processing circuit is presently not available that estimates input power without substantial signal processing overhead. Accordingly, what is needed in the art is a controller for a power processing circuit that can provide an estimate of the input power without consuming substantial signal processing resources.

SUMMARY OF THE INVENTION

These and other problems are generally solved or circumvented, and technical advantages are generally achieved, by advantageous embodiments of the present invention that include a controller for a power processing circuit. In one embodiment, the controller includes a multiplier configured to produce a product of an input current and an input voltage of the power processing circuit. The controller also includes a low-pass filter configured to produce an input power estimate of an input power to the power processing circuit as a function of the product of the input current and the input voltage.

In another embodiment, the controller includes a voltage loop compensator configured to produce a voltage compensation signal as a function of an output voltage of the power processing circuit. The controller also includes an input power estimator configured to produce an input power estimate of an input power to the power processing circuit as a function of the voltage compensation signal.

In a further embodiment, the controller including the power estimator is part of a redundant or non-redundant power converter system providing electrical power to a system external to the power converter. The external system may comprise a data processing system such as a server, a storage system, a data packet router, or any system requiring electrical power where an accurate input power estimate would be advantageous. The controller is configured to provide the input power estimate to the external system through a communications means, including but not limited to I$^2$C, Ethernet, a serial peripheral interface ("SPI") bus, or any other suitable electronic communications medium or protocol. The external system may command the controller to provide the input power estimate, or conversely, the controller may provide the input power estimate to the external system as part of a scheduled information transfer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely, a controller configured to estimate an input power to a power processing circuit coupleable to an ac power source. In an exemplary embodiment, a power processing circuit is a power converter coupled to an ac power source including a controller configured to estimate an input power thereto. The need to estimate accurately an input power to a power converter is a parallel need to the general objective to reduce energy consumed by an electronic system, for example as described in the U.S. Patent Application Publication No. 2008/0130322 (Ser. No. 11/710,276) entitled "Power System with Power Converters Having an Adaptive Controller," published Jun. 5, 2008 and U.S. Patent Application Publication No. 2008/0232141 (Ser. No. 12/051,334) entitled "Power System States," published Sep. 25, 2008 (claiming priority to U.S. Patent Application Ser. No. 60/918,806), which are incorporated herein by reference.

For a power processing circuit such as a power converter operating from ac input mains, the integration of a product of instantaneous input voltage and current over a time interval from a time t1 to t2 gives the total energy consumed in that time interval. For a power processing circuit whose input voltage and current are periodic, if the fundamental frequencies of the voltage and current are the same, then the integration of the product of instantaneous voltage and current over one fundamental cycle of the ac input power gives the energy consumed in one cycle. Hence, dividing the above integral by the time period gives power drawn by the power processing circuit. For a periodic function, integration over one cycle divided by the time period gives the average value of that function.

Alternatively, the average value of a signal can be obtained, or constructed, according to the principles of the invention by using a low-pass filter. Filtering the instantaneous product of a voltage and current with a low-pass filter such that the fundamental and harmonic frequency components thereof are substantially attenuated gives the average power drawn by the power processing circuit. It can be noted that filtering an instantaneous product of voltage and current is a method of estimating power, which can be applied for any electrical system having input voltage and current that are periodic in nature.

Figure 1:
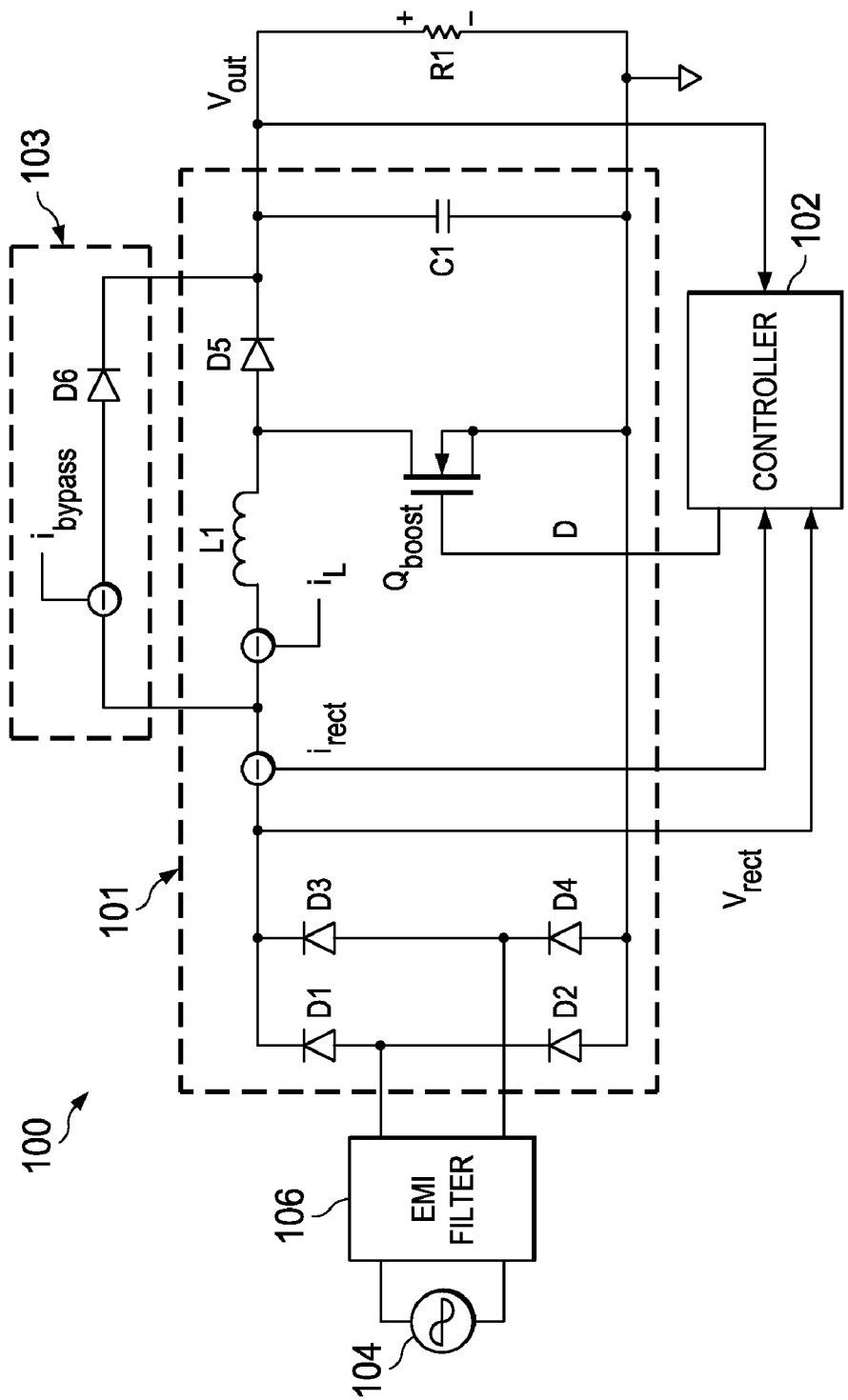
FIG. 1 illustrates a simplified schematic diagram of an embodiment of a power processing circuit including a controller constructed according to the principles of the invention.

Turning now to FIG. 1, illustrated is a simplified schematic diagram of an embodiment of a power processing circuit (e.g., a power converter) 100 including a controller 102 constructed according to the principles of the invention. The power converter includes a boost power stage 101 that may be configured to perform power factor correction, and a bypass path 103 comprising diode D6. An input power source 104 to the boost power stage 101 is an ac power source, which is coupled to a diode bridge rectifier comprising diodes D1, D2, D3, and D4 through EMI filter 106. The boost power stage 101, controlled by controller 102, produces a regulated output voltage $V_{out}$ across an output filter capacitor C1, which provides the output voltage $V_{out}$ to a load, represented by resistor R1.

The boost power stage 101 includes a boost power switch $Q_{boost}$ and diode D5, which alternately conduct to transfer power from the input power source 104 through an inductor L1 to the output filter capacitor C1. The controller 102 senses the output voltage $V_{out}$, the rectified input voltage $V_{rect}$, and bridge rectified current $i_{rect}$ to produce a signal D to control a duty cycle of the boost power switch $Q_{boost}$, thereby regulating the output voltage $V_{out}$ and the power factor of power drawn from the input power source 104. In this condition, bypass diode D6 would be reverse biased and hence the bypass current $i_{bypass}$ would be equal to zero and the bridge rectified current $i_{rect}$ would be equal to the inductor current $i_L$. The power converter 100 includes an electromagnetic interference ("EMI") filter 106 to reduce high-frequency conducted noise fed back to the input power source 104.

The bypass path 103 includes bypass diode D6 which would peak charge the output voltage $V_{out}$ in an unregulated fashion, when, for example, the control duty cycle D to the boost power switch $Q_{boost}$ is set to zero. In this condition, the inductor current $i_L$ would be equal to zero and the bridge rectified current $i_{rect}$ would be equal to the bypass current $i_{bypass}$.

Figure 2:
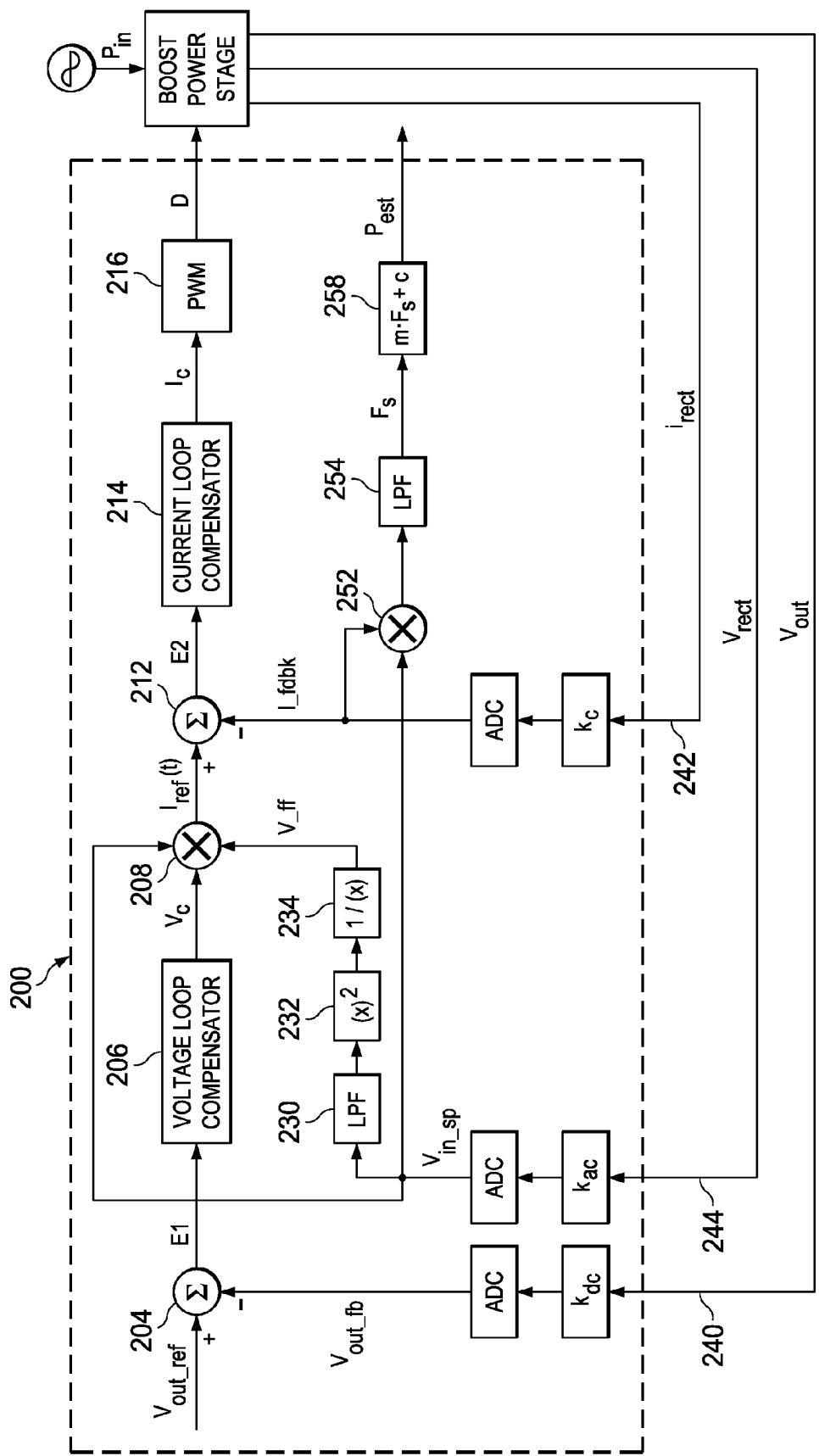
FIG. 2 illustrates a block diagram of an embodiment of a controller employable in a power processing circuit constructed according to the principles of the invention.

Turning now to FIG. 2, illustrated is a block diagram of an embodiment of a controller 200 employable in a power processing circuit (e.g., a power converter) constructed according to the principles of the invention. In an advantageous embodiment, the controller is implemented with a digital controller. The controller 200 is coupled to a boost power stage powered from an input power source, both of which were illustrated and described with reference to FIG. 1. An output voltage $V_{out}$ from the boost power stage is fed back in signal processing path or outer voltage loop 240 with a sensing gain $k_{dc}$ to an analog to digital converter (designated "ADC"), producing feedback signal $V_{out\_fb}$ (e.g., a scaled, digitized output voltage), which is subtracted from a reference output voltage $V_{out\_ref}$ in summer 204 to produce a first error signal E1. The first error signal E1 is coupled to a voltage loop compensator 206 that produces a voltage compensation signal $V_c$ therefrom provided to a multiplier 208. The voltage loop compensator 206 may advantageously comprise a PI ("proportional-integral") compensator cascaded with a high frequency pole.

The rectified input voltage $V_{rect}$ to the boost power stage is sensed in a signal processing path or voltage feed-forward loop 244 with sensing gain $k_{ac}$, converted to signal $V_{in\_sp}$ in digital format (e.g., a scaled, digitized input voltage) by an ADC. This signal is coupled to a second input of the multiplier 208. The signal $V_{in\_sp}$ is also coupled to an input of a feedforward circuit. The feedforward circuit filters the scaled, digitized input voltage $V_{in\_sp}$ in low-pass filter ("LPF") 230, squares the filtered scaled, digitized input voltage $V_{in\_sp}$ in squarer 232, the result of which is inverted in inverter 234. The result of the feedforward circuit is illustrated in FIG. 2 as a voltage feed-forward signal V_ff, and is coupled to a third input of the multiplier 208. An output signal from the multiplier 208 is a time-dependent current reference signal $I_{ref}(t)$, which sets a desired current waveform for an inductor in the boost power stage.

The controller 200 senses a bridge rectified current $i_{rect}$ in a signal processing path or inner current loop 242 with sensing gain $k_c$, which is coupled to an ADC, producing current feedback signal I_fdbk (e.g., a scaled, digitized bridge rectified current). The current feedback signal I_fdbk is subtracted from the time-dependent current reference signal $I_{ref}(t)$ of the multiplier 208 in a summer 212. The result of this subtraction (e.g., a second error signal E2) is coupled to a current loop compensator 214 that produces a current compensation signal $I_c$ that is provided to a pulse-width modulator ("PWM") 216. The pulse-width modulator 216 produces a signal D to control duty cycle of a boost power switch in the boost power stage that was illustrated and described with reference to FIG. 1. The current loop compensator may advantageously comprise a PI compensator cascaded with a lead compensator.

The bandwidth of the outer voltage loop 240 is typically around five hertz ("Hz"), and the bandwidth of the inner current loop 242 is typically around five kilohertz ("kHz"). Other bandwidths may be used depending on system requirements. The voltage feed-forward loop 244 is implemented to improve the line transient performance of a power converter.

To achieve less total harmonic distortion in the input current and high power factor, the sampling frequency of the scaled rectified input voltage $V_{rect}$ is chosen to be large enough (preferably 10 kHz or higher in many applications) to reconstruct the rectified input voltage $V_{rect}$ with little distortion. Similarly, the sampling rate of the bridge rectified current $i_{rect}$ is done at least at the switching frequency of a boost power switch of the boost power stage, which typically is of the order of 100 kHz or higher in recent commercial product designs.

Additionally, the scaled, digitized input voltage signal $V_{in\_sp}$ (indicative of the rectified input voltage $V_{rect}$ or the input voltage to the power converter) from the ADC and the current feedback signal I_fdbk (indicative of the bridge rectified current $i_{rect}$), are multiplied in a multiplier 252 (to produce a product of the input voltage and input current), for example at a 10 kHz rate, and are fed into a low-pass filter 254. The low-pass filter 254 may be implemented with a frequency response shaped so that the fundamental and higher harmonic frequencies of the rectified ac line voltage are substantially reduced. Low-pass filters with a desired frequency response can be readily implemented using design procedures well known in the art. A series of cascaded low-pass filters can also be used as necessary to achieve an attenuation level for harmonic components. Since both an input voltage and an input current of a boost power stage are available in digital format at a high sampling rate, for instance, in the controller illustrated in FIG. 2, the active power drawn by the boost power stage can be accurately estimated.

In an advantageous embodiment, a two-stage, cascaded, low-pass filter is implemented, without limitation, in a "C" computer language, each stage with a corner frequency at 12 Hz and with a computational repetition rate of 10 kHz. The representation and implementation of a low-pass filter in a computer language such as C is well known in the art, and will not be described here further in the interest of brevity. Of course, other filter structures, such as cascaded band stop filters to remove the higher order harmonics, may be used.

A filter output signal $F_s$ represents a quantity that is a measure of the average input power to a boost power stage. In an ideal case when the filter output signal $F_s$ is multiplied by a conversion factor, m, an estimate of average input power, in watts for example, is thereby produced. However, due to non-idealities in sensing circuits, for instance, when an additive but unknown bias current is present in a sense circuit or, as is typically the case, an operational amplifier exhibits a small but unknown offset voltage or a component deviates from a nominal value by tolerance, etc., or due to non-idealities in digital computation, for example, errors introduced due to truncation and round-off, deviations are unavoidably introduced between an actual and an estimated value of average input power.

To improve accuracy of the estimated value of average input power, in an advantageous embodiment, a linear or higher-order fitting equation, e.g., a linear equation of the form m·x+c, where "m" and "c" are fitting constants and "x" is an independent variable, may be used for the conversion represented in a conversion circuit 258. The parameters of the fitting equation, e.g., m and c, can be determined for a given power converter during a calibration process by comparing estimated power with an actual average input power measurement, preferably in a controlled environment, using calibration processes well-known in the art. Fitting equations can also be used for variations with respect to input line voltage, an operating temperature, etc.

It is noted that any error in generating the bridge rectified current $i_{rect}$ and the scaled, digitized input voltage signal $V_{in\_sp}$, which are the inputs to the multiplier 252, would lead to an error in the estimated power. Hence, to improve the accuracy over wide input voltage and load conditions, calibration can also be done individually for these parameters. In such cases, it would be preferable to carry out a calibration of the input power after completing the calibration of the individual parameters, such as the bridge rectified current $i_{rect}$ and digitized input voltage signal $V_{in\_sp}$.

As the bridge rectified current $i_{rect}$ is used, the power estimator works well for both the conditions when the power processing is done by the boost power stage 101 regulating the output voltage $V_{out}$, as well as when the boost power stage 101 is switched off, whereby the output voltage $V_{out}$ is peak charged in a unregulated fashion through the bypass path 103. In the latter case, since the bridge rectified current $i_{rect}$ would be peaky in nature and since the controller 102 would have a lower computational load (as no processing is required to control the boost power stage 101), the sampling and the computational rates to estimate the input power can be increased to closely track the peak-natured current, and thereby accurately estimate the input power. Calibration may be done for this mode of operation to improve accuracy further.

Thus, a process to estimate average input power for a power processing circuit that may be coupled to an ac (or a dc) input power source has been introduced that processes a product of an input voltage times an input current to a power processing circuit with a filter (preferably a low-pass filter). The process avoids the need to form an integral of a product of an instantaneous input current and voltage over a cycle of an input voltage waveform, thereby avoiding the need for substantial computing resources to make an average input power estimate.

In the Designer Reference Manual from Freescale Semiconductor, Inc., entitled "Design of a Digital AC/DC SMPS Using the 56F8323 Device," (2005), in Section 5.2.2 (equation 5.5) therein, it was shown that for a sinusoidal input voltage to a power converter, the voltage compensation signal $V_c$ of the voltage loop compensator 306 is proportional to the input power drawn by a boost power stage controlled with power-factor correction. The relationship between the input power drawn by the boost power stage and the output signal of the voltage loop compensator for input voltages having harmonic content up to, without limitation, the 11$^{th}$ harmonic of the input ac voltage and total harmonic distortion less than, without limitation, ten percent is numerically established as described herein.

Figure 3:
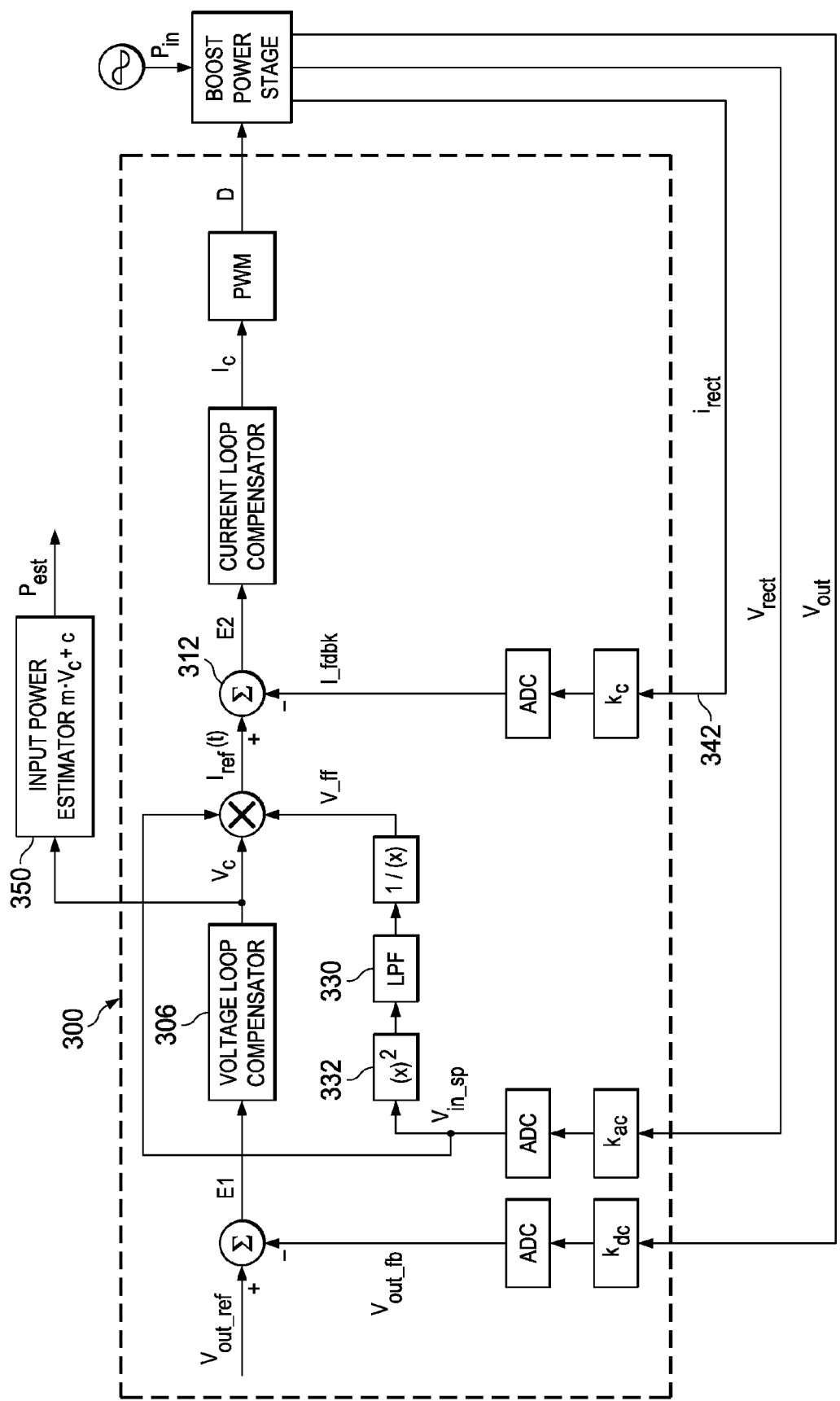
FIGS. 3 and 4 illustrate block diagrams of further embodiments of a controller employable in the power processing circuit constructed according to the principles of the invention.

Turning now to FIG. 3, illustrated is a block diagram of another embodiment of a controller 300 employable in the power processing circuit (e.g., a power converter) constructed according to the principles of the invention. A difference between the feedback circuit of the controllers described in FIG. 2 and FIG. 3 is that the signal-processing order of a squaring function 332 and a low-pass filter 330 has been inverted before generating a voltage feed-forward signal V_ff. The average input power estimating process described previously herein would not be affected by this modification, but is preferable for the process as described below. Remaining elements in FIG. 3 and in following figures that are similar to similarly numbered elements in a previous figure and will not be described in the interest of brevity.

A signal that is proportional to the mean-square value of the rectified input voltage $V_{rect}$ may be provided by squaring the $V_{in\_sp}$ signal (a scaled, digitized rectified input voltage) and coupling the squared result to a low-pass filter 330 with a corner frequency that substantially attenuates the fundamental of the line frequency and higher harmonic frequency components. Thus, the controller described in FIG. 3 generates a voltage feed-forward signal V_ff that is inversely proportional to the mean-square value of the rectified input voltage $V_{rect}$.

Hence, from the structure illustrated in FIG. 3, the time-dependent current reference signal $I_{ref}(t)$ applied within the controller (i.e., the signal applied to the non-inverting input of an summer 312) can be written as EQN 1:

$$I_{ref}(t)=V_c \cdot V_{rect}(t)/(V_{rms}^2 \cdot k_{ac} \cdot k_{adc} \cdot k_{lpf}),$$

wherein $k_{adc}$ represent the signal processing gain of the ADC that provides the scaled, digitized input voltage signal. $V_{in\_sp}$, $k_{lpf}$ represents gain of the low-pass filter 330, and $V_{rms}^2$ represents the square of the RMS value of the rectified input voltage $V_{rect}$. The voltage compensation signal $V_c$ represents the output of the voltage loop compensator 306. The boost power stage inductor current $i_L$ (which is same as the bridge rectified current $i_{rect}$ when the controller 102 is regulating the output voltage $V_{out}$, as previously discussed) in response to the inner current loop 342, can be determined as set forth in EQN 2:

$$i_L(t)=G(V_c \cdot V_{rect}(t)/(V_{rms}^2 \cdot k_{ac} \cdot k_{adc} \cdot k_{lpf})),$$

wherein the function G( ) represents the response of the inner current loop 342. At a steady-state condition, the average input power and the RMS input voltage are constant, and hence EQN 2 can be written as EQN 3:

$$i_L(t)=[V_c/(V_{rms}^2 \cdot k_{ac} \cdot k_{adc} \cdot k_{lpf})] \cdot G(V_{rect}(t)).$$

The instantaneous input power $P_{in}(t)$ to the power converter can be written as EQN 4:

$$P_{in}(t)=V_{rect}(t) \cdot i_L(t).$$

Substituting EQN 3 into EQN 4 produces EQN 5:

$$P_{in}(t)=[V_c/(V_{rms}^2 \cdot k_{ac} \cdot k_{adc} \cdot k_{lpf})] \cdot G(V_{rect}(t)) \cdot V_{rect}(t).$$

The average input power $P_{dc}$ to the boost power stage can be obtained by integrating EQN 5 over one cycle of the ac input waveform to produce EQN 6:

$$P_{dc} = \left(\frac{1}{T}\right) \cdot \frac{V_c}{V_{rms}^2 \cdot k_{ac} \cdot k_{adc} \cdot k_{lpf}} \cdot \int V_{rect}(t) \cdot G(V_{rect}(t)) \cdot dt$$

$$P_{dc} = \left[\frac{V_c}{k_{ac} \cdot k_{adc} \cdot k_{lpf}}\right] \cdot \lambda$$

wherein as set forth in EQN 7:

$$\lambda = \frac{1}{T \cdot V_{rms}^2} \cdot \int G(V_{rect}(t)) \cdot V_{rect}(t) \cdot dt.$$

In EQN 6, all factors except $\lambda$ are known. Hence the equation to estimate the average input power can be written, neglecting the factor $\lambda$, as EQN 8:

$$P_{est}=V_c/(k_{ac} \cdot k_{adc} \cdot k_{lpf}).$$

Thus, from EQN 8 it can be seen that the voltage compensation signal $V_c$ is a measure of the average input power to a boost power stage. In an ideal case when the voltage compensation signal $V_c$ is multiplied by a conversion factor, m, an estimate of average input power, in watts for example, is thereby produced with a percentage error between the actual and the estimate given by the EQN 9.

$$\%\_Error = 100 \cdot (P_{dc} - P_{est})/P_{dc}$$
$$= 100 \cdot (\lambda - 1)/\lambda.$$

The value of $\lambda$ was numerically estimated to be quite close to unity, and the corresponding percentage error was estimated to be less than 0.15 percent for input voltage having harmonic content up to $11^{th}$ harmonic and total harmonic distortion less than 10 percent. Hence, the input power can be accurately estimated using an ideal estimator where the voltage compensation signal $V_c$ is multiplied by a conversion factor, m, to get an estimate of average input power.

To minimize the error introduced due to non-idealities in the system, and to improve the accuracy of the estimated value of average input power, in an advantageous embodiment, a linear or higher-order fitting equation can be used for the power estimator 350, and the parameters therein can be calibrated.

Figure 4:
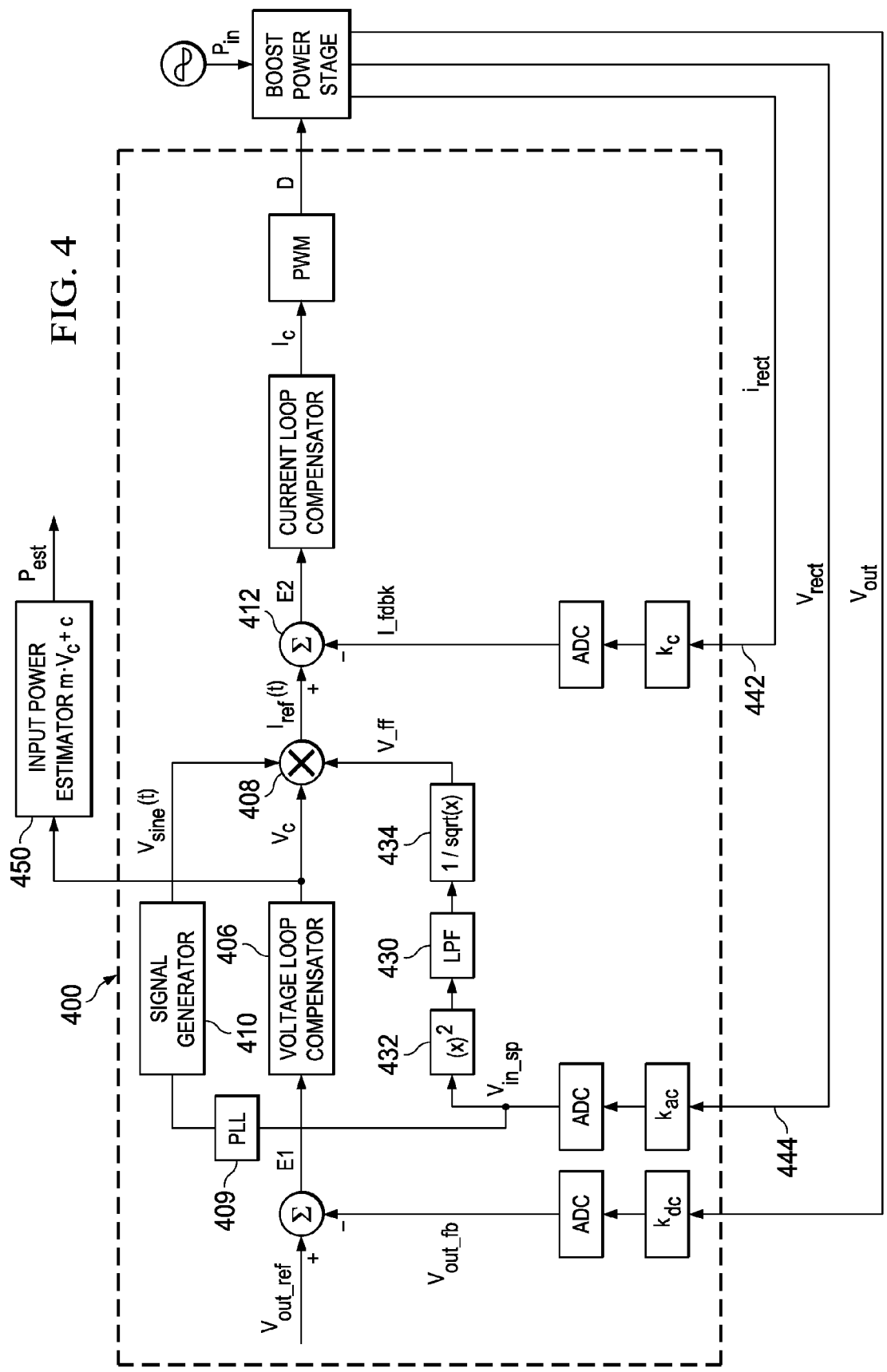

Turning now to FIG. 4, illustrated is a block diagram of a further embodiment of a controller 400 employable in a power processing circuit (e.g., a power converter) constructed according to the principles of the invention. Differences between the controllers described in FIGS. 3 and 4 are as follows: First, a reference rectified sine wave, $V_{sine}(t)$, of fixed amplitude, generated from a signal generator 410 that is phase-locked with the rectified input voltage signal $V_{inst\_sp}$ using a phase-locked loop ("PLL") 409, is used as one of the inputs to the multiplier 408, instead of the $V_{inst\_sp}$ signal as illustrated in FIG. 3. Second, a modification in the feedforward path 444, wherein the inversion block 434 does the inversion of the square-root of the signal fed from the LPF 430 instead of the simple inversion as illustrated in FIG. 3. It can be shown that the voltage compensation signal $V_c$ of voltage loop compensator 406 is a measure of the average input power to a boost power stage. In an ideal case when the voltage compensation signal $V_c$ is multiplied by a conversion factor, m, as illustrated in block 450, an estimate of average input power, in watts, for example, can be obtained, similar to the case discussed with reference to FIG. 3. Again, a linear or higher order conversion unit can be used, and the parameters of the same can be calibrated to improve the accuracy of power estimation.

The first power estimation process introduced above with respect to FIG. 2 to estimate average input power, without limitation, for a boost power stage that may or may not be controlled with power-factor correction, using a low-pass filter to filter a product of instantaneous voltage and current may be numerically verified using a MathCad™ spreadsheet. Arbitrary voltage and current waveforms, each with fundamental frequencies of 100 Hz, may be numerically generated for 100 cycles of the ac input waveform.

Figure 5:
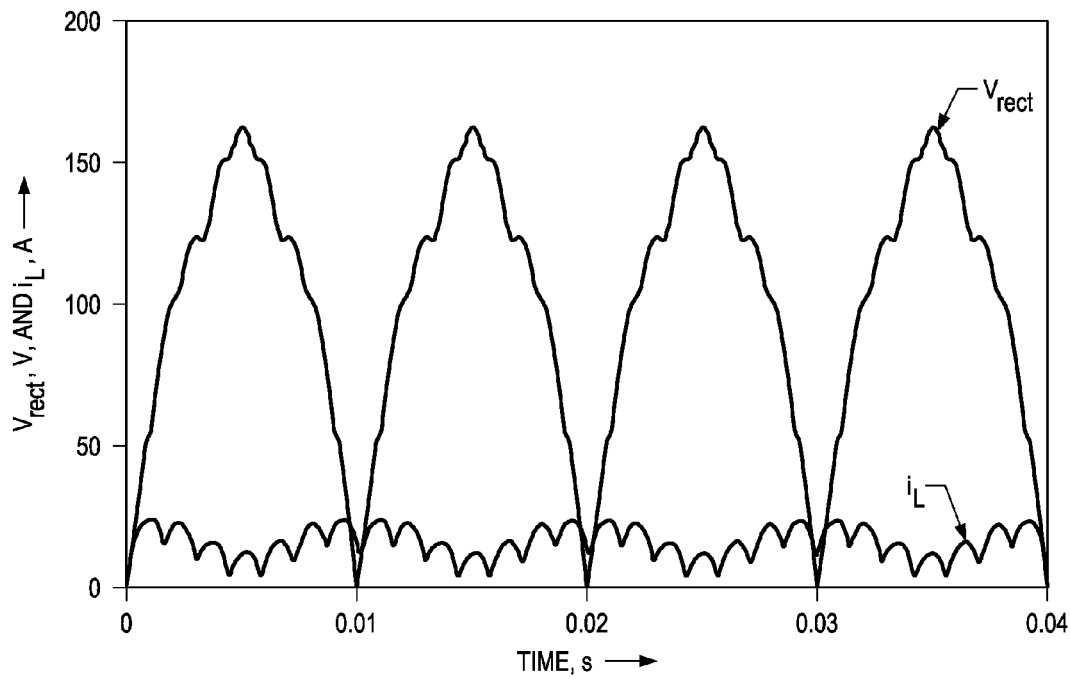
FIG. 5 illustrates numerically generated waveforms for rectified input voltage and inductor current for two cycles of the ac input voltage employed in a simulation in accordance with a power converter employing the controller of FIG. 2.
Figure 6:
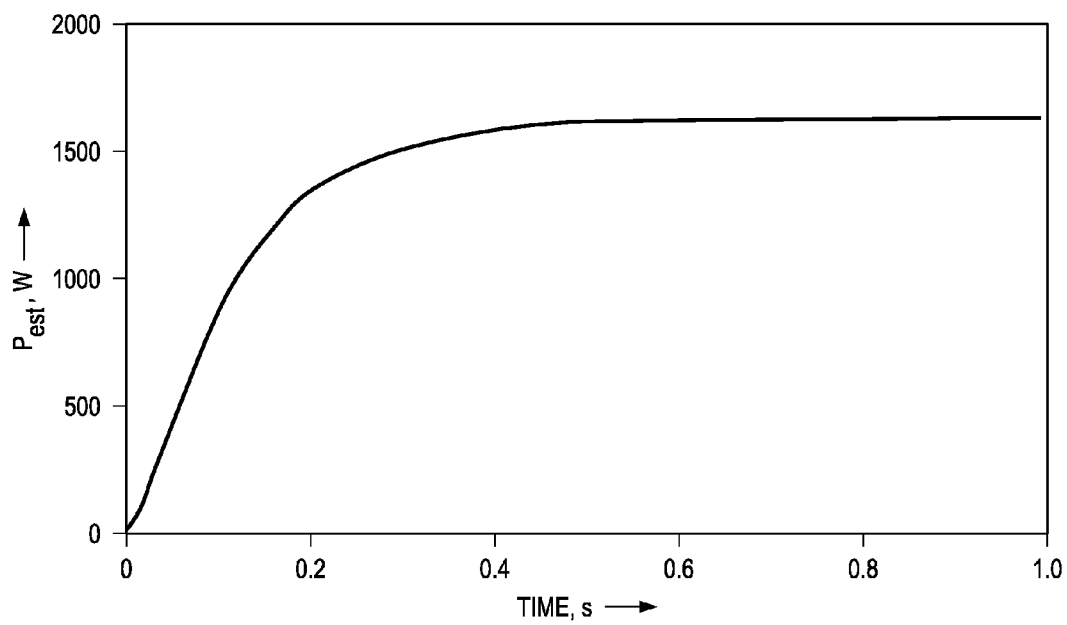
FIG. 6 illustrates a waveform of an input power estimate with respect to time in accordance with the controller of FIG. 2.

Turning now to FIG. 5, illustrated are numerically generated waveforms for rectified input voltage $V_{rect}$ and inductor current $i_L$ for two cycles of the ac input voltage employed in a simulation in accordance with a power converter employing the controller of FIG. 2. Input power is calculated by integrating the instantaneous product of input voltage and inductor current numerically over one ac input voltage waveform cycle. Input power is also calculated numerically by filtering the product of the voltage and current samples for 100 ac input voltage waveform cycles using a two-stage, cascaded, low-pass filter, each with a corner frequency at 12 Hz. FIG. 6 illustrates a waveform of an input power estimate $P_{est}$ with respect to time in accordance with the controller illustrated and described with respect to FIG. 2.

The steady state value of the filtered output may be compared with the numerical integration method and found that the percentage error is insignificant. Thus, a process as introduced above that uses a low-pass filter to filter a product of instantaneous voltage and current can advantageously produce an accurate estimate of input power for a boost power stage.

Figure 7:
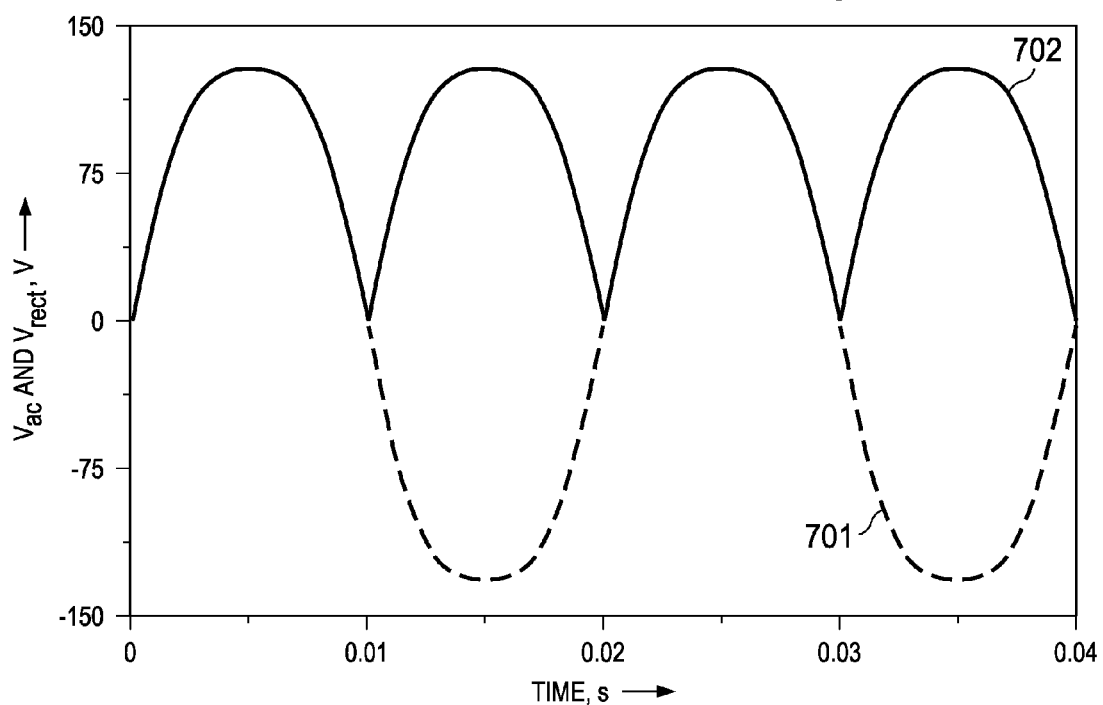
FIG. 7 illustrates a waveform of two cycles of an exemplary ac input voltage and a corresponding exemplary rectified ac input voltage produced in a simulation in accordance with a power converter employing the controller of FIG. 3.

Regarding the controller illustrated and described with respect to FIG. 3, the value of the parameter λ and the percentage error introduced due to assuming its value is unity may be estimated using MathCad™ for different ac line harmonic conditions. The ac input voltage waveform in the time domain with a selected amount of harmonic content is numerically generated. The rectified input ac line voltage is generated by taking the absolute value of the ac input voltage waveform. FIG. 7 illustrates a waveform of two cycles of an exemplary ac input voltage 701 and a corresponding exemplary rectified ac input voltage 702 (which coincides with the ac input voltage for portions of a cycle and thus hides portions thereof) produced in a simulation in accordance with a power converter employing the controller of FIG. 3. The waveform of FIG. 7 provides the fundamental component of the ac input voltage equal to 100 volts ("V") and the amplitude of the third harmonic equal to 10 V, with no phase shift relative to the fundamental component.

The inner current loop 342 illustrated in FIG. 3 may be modeled in MathCad™ as a first-order system with a corner frequency at two kHz. The function $G(V_{rect}(s))$ may be obtained by calculating the response of the inner current loop 342 loop to the Fast Fourier Transform ("FFT") of the rectified input voltage $V_{rect}(s)$, where the symbol "s" represents the complex argument of the respective transformed function in the frequency domain. The function $G(V_{rect}(t))$ is obtained by taking the inverse FFT of $G(V_{rect}(s))$. Then the value of λ was calculated by integrating EQN 7 numerically, and the corresponding percent error "%_error" is calculated using EQN 9.

The result obtained for different values of harmonic content in the ac input voltage waveform is tabulated below in TABLE I for 15 exemplary cases ("Cond. No."). In each case, the amplitude of the fundamental component of the ac input voltage waveform is 100 V. The amplitudes of the third, fifth, seventh, ninth, and eleventh harmonic components are as tabulated. The angle associated with various harmonic components shown in TABLE I is the phase angle of the harmonic waveform at the zero crossings of the fundamental component of the waveform. The values of total harmonic distortion $V_{thd}$ shown in the second-rightmost column of TABLE I is an approximate value for illustrative purpose only. The percentage error ("error (%)") of the estimated input power to the boost power stage is shown in the rightmost column of TABLE I.

TABLE I

| Cond. No. | Harmonic Value (in $V_{rms}$) @ angle (deg.) | | | | | | $V_{thd}$ (%) | Error (%) |
|---|---|---|---|---|---|---|---|---|
| | $1^{st}$ | $3^{rd}$ | $5^{th}$ | $7^{th}$ | $9^{th}$ | $11^{th}$ | | |
| 1 | 100 | 0 | 0 | 0 | 0 | 0 | 0 | −0.085 |
| 2 | 100 | 10 @ 0 | 0 | 0 | 0 | 0 | 10 | −0.089 |
| 3 | 100 | 10 @ 45 | 0 | 0 | 0 | 0 | 10 | −0.089 |
| 4 | 100 | 10 @ 90 | 0 | 0 | 0 | 0 | 10 | −0.09 |
| 5 | 100 | 10 @ 135 | 0 | 0 | 0 | 0 | 10 | −0.09 |
| 6 | 100 | 10 @ 180 | 0 | 0 | 0 | 0 | 10 | −0.091 |

TABLE I-continued

| Cond. No. | 1st | 3rd | 5th | 7th | 9th | 11th | $V_{thd}$ (%) | Error (%) |
|---|---|---|---|---|---|---|---|---|
| 7 | 100 | 10 @ 270 | 0 | 0 | 0 | 0 | 10 | −0.09 |
| 8 | 100 | 10 @ 315 | 0 | 0 | 0 | 0 | 10 | −0.089 |
| 9 | 100 | 0 | 10 @ 45 | 0 | 0 | 0 | 10 | −0.098 |
| 10 | 100 | 0 | 0 | 10 @ 270 | 0 | 0 | 10 | −0.112 |
| 11 | 100 | 0 | 0 | 0 | 10 @ 90 | 0 | 10 | −0.129 |
| 12 | 100 | 0 | 0 | 0 | 0 | 10 @ 315 | 10 | −0.149 |
| 13 | 100 | 5 @ 0 | 5 @ 0 | 5 @ 0 | 5 @ 0 | 0 | 10 | −0.102 |
| 14 | 100 | 0 | 5 @ 0 | 5 @ 0 | 5 @ 0 | 5 @ 0 | 10 | −0.114 |
| 15 | 100 | 8 @ 0 | 7 @ 180 | 0 | 0 | 0 | 10 | −0.096 |

Figure 8:
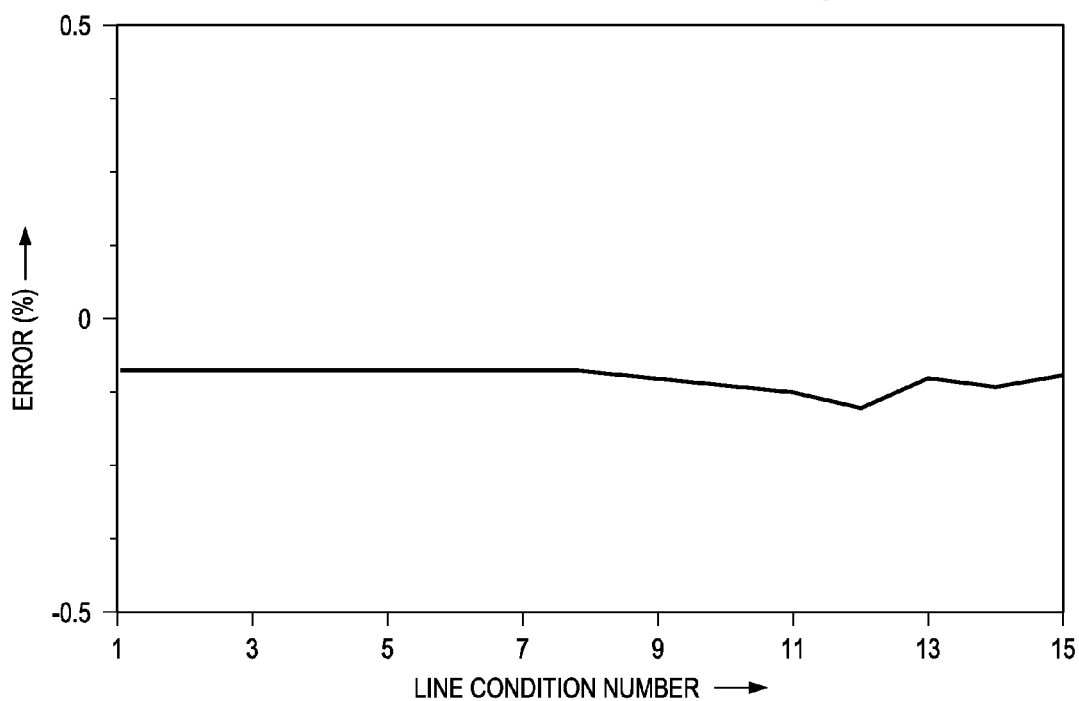
FIG. 8 illustrates a waveform of a variation of percentage error of an estimated input power with respect to various input line conditions in a simulation in accordance with a power converter employing the controller of FIG. 3.

Turning now to FIG. 8, illustrated is a plot of a variation of percentage error ("error (%)") of an estimated input power in accordance with a power converter employing the controller of FIG. 3. The percentage error of the estimated input power is provided with respect to the input ac line condition. It is evident in FIG. 8 that the percentage error introduced due to assuming a unity value for the factor λ may be considered insignificant.

An experimental setup may be constructed using a 650-watt power converter to validate the input power estimation processes introduced herein. The power converter included a power-factor corrected, single-phase, boost power stage drawing power from an ac line. The output of the boost power stage was converted to 12 V by an isolated, dc-dc power converter. The controller for the boost power stage may be realized using a digital controller, similar to one illustrated and described previously hereinabove.

A microcontroller may be used on the secondary side of the power converter to provide an interface with an external system (such as a server or storage processor) for supervisory activities. In addition, a universal asynchronous receiver transmitter ("UART") communication link (or any other suitable communication link) may be provided between the digital controller on the primary side of the isolation boundary of the dc-to-dc section and the microcontroller on the secondary side of the isolation boundary. The estimated power calculated by the digital controller may be monitored by an external system via the above-mentioned communication link. The communication update rate through the UART communication link may be about every ten milliseconds ("ms"), depending on the requirements of the external system. Voltages and currents in the aforementioned setup are measured using typical laboratory procedures.

In a mass production application, it may be advantageous to calibrate the controller at some point during the manufacturing process, perhaps during a test process using automated test equipment ("ATE"). With continuing reference to the controller of FIGS. 2, 3, and 4, the fitting parameters m and c used to calculate the estimated input power may be calibrated at 20 amperes ("A") and 40 A of load current, at an ac input voltage of 110 V with zero total harmonic distortion ("THD"), and with a line frequency of 60 Hz, for example, The ATE may then communicate appropriate calibration parameters for m and c to the controller, allowing the controller to use the stored calibration parameters to improve the accuracy of an estimated input power. The calibration process may be carried out for multiple operating points to improve overall accuracy, for example, at multiple ac input line frequencies, multiple line voltages, multiple harmonic distortion contents, and multiple output power levels.

As a further example, the input voltage may be set at three different line conditions. The first is a substantially pure sine wave of 110 V. The second is a fundamental component of 110 V plus a third harmonic of 11 V at zero degrees relative to the fundamental. The third is a fundamental component of 110 V plus a ninth harmonic of 11 V at zero degrees relative to the fundamental.

Figure 9:
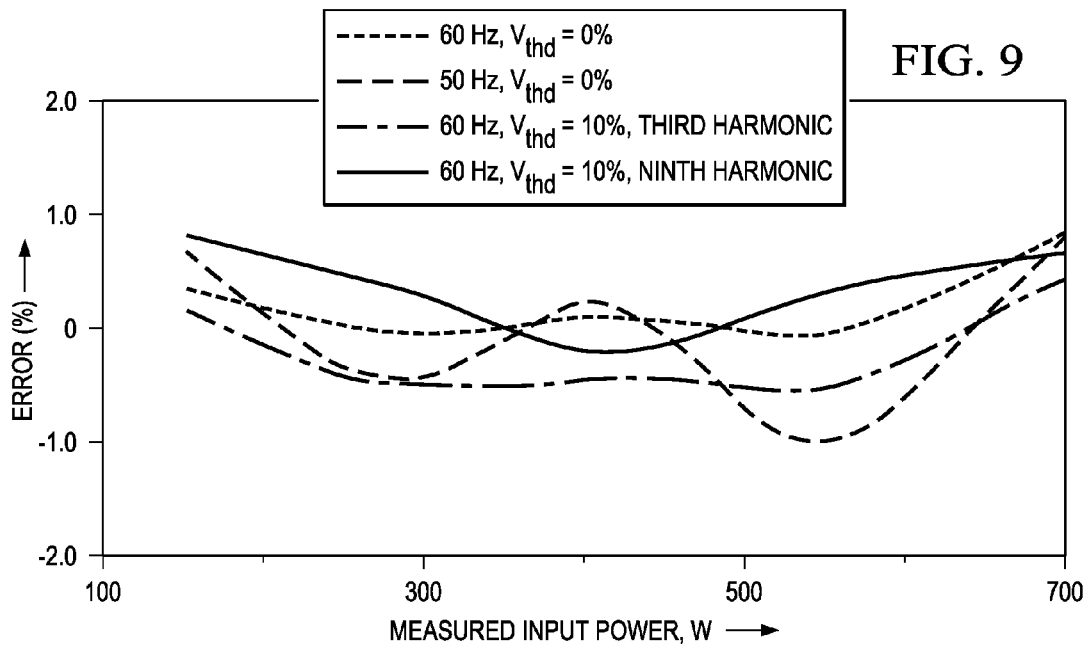
FIG. 9 illustrates waveforms of a percentage error of an estimated input power versus a measured input power obtained experimentally in accordance with a power converter employing the controller of FIG. 2.

Turning now to FIG. 9, illustrated are plots of a percentage error of an estimated input power versus a measured input power in accordance with a power converter employing the controller of FIG. 2. More specifically, the illustrated plots provide the percentage error for the input power estimate for a process in which a low-pass filter filters a product of an input voltage times an input current to the power converter.

Figure 10:
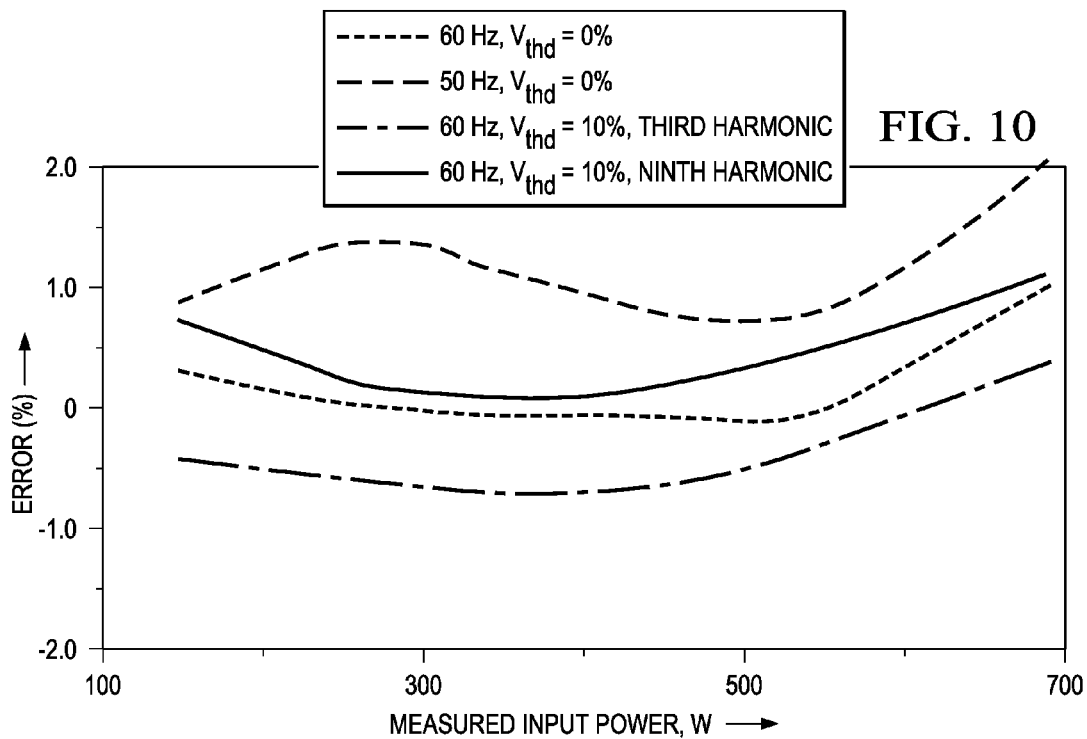
FIG. 10 illustrates waveforms of a percentage error of an estimated input power versus a measured input power obtained experimentally in accordance with a power converter employing the controller of FIG. 3.

Turning now to FIG. 10, illustrated are plots of a percentage error of an estimated input power versus a measured input power in accordance with a power converter employing the controller of FIG. 3. More specifically, the illustrated plots provide the percentage error for the input power estimate for a process in which a voltage compensation signal of a voltage loop compensator is scaled by gains and processed by an input power estimator. It is evident from the plots of FIGS. 9 and 10 that errors in the input power estimate are well within a +/−2% error band for a wide range of load and input voltage harmonic conditions.

It has thus been shown that the input active power drawn by a power converter can be accurately estimated, for example, with accuracy better than +/−2%, with a process that advantageously employs a modest expenditure of signal-processing resources. The input power in accordance with a power converter can be estimated by filtering the integrated value of a product of instantaneous voltage and current with a low-pass filter. Alternatively, the input power in a power converter can be estimated by scaling a voltage compensation signal of a voltage loop compensator processed by an input power estimator.

Figure 11:
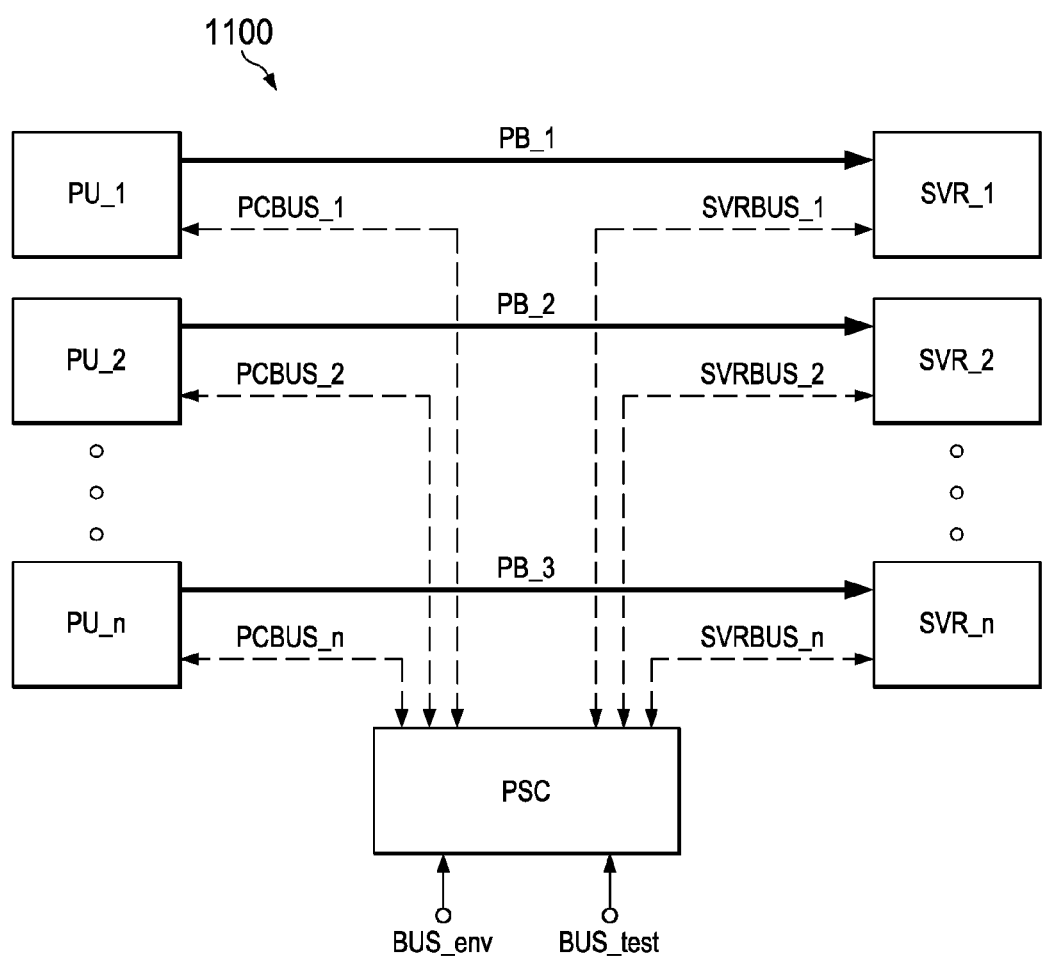
FIG. 11 illustrates a block diagram of an embodiment of a power system coupled to loads and including power converters controlled by a power system controller, constructed according to the principles of the invention.

Turning now to FIG. 11, illustrated is a block diagram of an embodiment of a power system, 1100, coupled to loads, including power converters controlled by a power system controller (designated "PSC"), constructed according to the principles of the invention. The power system is operable in a plurality of operational states, each with an associated power level. A requirement occurring with increasing frequency for systems of recent design is to measure and report the power drawn by system elements in their various operational states so that the total energy consumed by the system can be minimized, for example, by the power system controller.

The loads in FIG. 11 are represented, without limitation, by a plurality of servers (designated "SVR_1 . . . SVR_n" and also referred to as "SVR") powered by respective power converters (designated "PU_1 . . . PU_n" and also referred to as "PU") over respective power buses (designated "PB_1 . . . PB_n" and also referred to as "PB"). Each server SVR may be individually coupled over respective server buses (designated "SVRBUS_1 . . . SVRBUS_n" and also referred to as "SVR-BUS") to a respective power converter PU for its power source as illustrated herein, or may be coupled to more than one power converter PU and powered in a redundant manner to form multiple redundant power converters PU. The power system controller may also be powered by one of the illustrated power converters PU, or by another power converter not shown.

The power converters PU are coupled to the power system controller PSC over respective power converter communication buses (designated "PCBUS_1 . . . PCBUS_n" and also referred to as "PCBUS") that conduct signals therebetween to communicate requests for a power converter operational state $PC_{op\_state}$ from the power system controller PSC to a power converter PU. The power system controller PSC may also be coupled over a bus (designated "BUS_env") to a circuit element (not shown) signaling an environmental parameter such as a component temperature. In addition, the power system controller PSC may be coupled over a bus (designated "BUS_test") to a signal source such as a manufacturing test set that provides a power converter parameter measured after a manufacturing step. The power system controller PSC receives signals representing a power converter status $PC_{status}$ from the power converters PU over the respective power converter communication buses PCBUS and transmits commands thereover for the power converter operational states $PC_{op\_state}$ to the power converters PU. A signal transmitted by a power converter may include an estimate of its input power, which is communicated to the power system controller over its respective power converter communication bus. The commands for the power converter PU to enter the power converter operational states $PC_{op\_state}$, which may advantageously include consideration of the estimate of power converter input power, can be used to enhance (e.g., optimize) an operational efficiency or reliability of the power converter PU at a power system level. The ability of a power converter to estimate accurately its input power is thus essential to minimizing the energy consumed by the system.

Thus, a controller configured to estimate a power level in a power processing circuit that can be coupled to an ac power source has been described. In one embodiment, the controller includes a multiplier configured to produce a product of an input current and an input voltage of the power processing circuit. The controller also includes a low-pass filter configured to produce an input power estimate of an input power to the power processing circuit as a function of the product of the input current and the input voltage. In an exemplary embodiment, the input power estimate is an output signal of the controller. In an exemplary embodiment, the controller modifies the input power estimate with a linear correction in a conversion circuit to produce a signal substantially proportional to the input power of the power processing circuit. In an exemplary embodiment, the multiplier and low-pass filter include a digital circuit. The controller can also control a power factor of the power processing circuit.

In another embodiment, the controller includes a voltage loop compensator configured to produce a voltage compensation signal as a function of an output voltage of the power processing circuit. The controller also includes an input power estimator configured to produce an input power estimate of an input power to the power processing circuit as a function of the voltage compensation signal. In an exemplary embodiment, the input power estimate is an output signal of the controller. In an exemplary embodiment, the controller further includes a feedforward circuit that produces a signal inversely proportional to a filtered square of an input voltage to the power processing circuit, and a multiplier coupled to an output of the voltage loop compensator and to the feedforward circuit. The controller further includes a summer that forms a difference between an output of the multiplier and a signal representing a current in an inductor of a boost power stage of the power processing circuit, and a current loop compensator coupled to the summer. An output of the current loop compensator is coupled to a pulse-width modulator, and an output of the pulse-width modulator is coupled to a power switch of the boost power stage. In an exemplary embodiment, the input power estimator is coupled to an output of the voltage loop compensator, and employs a relationship that may be a linear relationship in a conversion circuit to produce the input power estimate. The filtered square of an input voltage to the power processing circuit is filtered to attenuate substantially a fundamental and its higher harmonic frequency components of an ac input line powering the power processing circuit. In an exemplary embodiment, the input power estimator includes a digital circuit.

Another exemplary embodiment of the invention provides a method of operating a power processing circuit. In accordance with one exemplary embodiment, the method includes controlling a power factor of the power processing circuit by coupling a voltage loop compensator to an output characteristic of the power processing circuit, and producing a signal indicative of input power to the power processing circuit from an output of the voltage loop compensator. In an exemplary embodiment, the method includes producing a feedforward signal inversely proportional to a filtered square of an input voltage to the power processing circuit, and multiplying an output of the voltage loop compensator, the feedforward signal, and the rectified input voltage to form a product. The method further includes forming a difference between the product and a current signal representing a current in an inductor of the power processing circuit, coupling a current loop compensator to the summer, generating a pulse-width modulated signal from an output of the current loop compensator, and controlling a power switch of the power processing circuit with the pulse-width modulated signal. In accordance with an exemplary embodiment, the method further includes using a linear relationship in a conversion circuit to produce the signal indicative of input power from the output of the voltage loop compensator. In accordance with an exemplary embodiment, the method further includes filtering the square of the input voltage to the power processing circuit with a filter that substantially attenuates a fundamental and its higher harmonic frequency components of an ac input line powering the power processing circuit. In an exemplary embodiment, the method includes using a digital circuit to produce the input power estimate. In an exemplary embodiment, the method includes producing an output signal of the controller from the input power estimate.

In an exemplary embodiment, the input power estimate may be performed with the boost power factor correction ("PFC") circuit inactive, or with the PFC circuit configured to provide a power factor between about 0.5 and 0.95. In an exemplary embodiment, the input power estimate may be performed using a substantially dc input power source, with or without the boost circuit active.

In an exemplary embodiment, the controller may be calibrated to improve the accuracy of the input power estimate. The calibration parameters may be determined at a manufacturing test process using an ATE, with the calibration parameters stored in a nonvolatile memory for use by the controller during the input power estimate process.

In an exemplary embodiment, the controller, including the power estimator, is part of a power converter system, redundant or non-redundant, providing electrical power to a system external to the power converter. The external system may comprise a data processing system such as a server, a storage system, a data packet router, or any system requiring electrical power where an accurate input power estimate would be advantageous. The controller is configured to provide the input power estimate to the external system through a communications means, including but not limited to I²C, Ethernet, a SPI bus, or any suitable electronic communications medium. The external system may command the controller to provide the input power estimate, or conversely, the controller may provide the input power estimate to the external system as part of a scheduled information transfer.

Another exemplary embodiment of the invention provides a method of producing an input power estimate of a power processing circuit. In an exemplary embodiment, the method includes multiplying a current and a voltage to produce a current-voltage product, and filtering the current-voltage product with a low-pass filter to produce the input power estimate. In an exemplary embodiment, the method further includes modifying the input power estimate with a linear correction in a conversion circuit to produce a signal substantially proportional to a power level. In a further exemplary embodiment, the method includes performing the multiplication and the filtering with a digital circuit. In an exemplary embodiment, the method includes producing an output signal of the controller from the input power estimate.

Those skilled in the art should understand that the previously described embodiments of an input power estimator and related methods are submitted for illustrative purposes only. Those skilled in the art understand further that various changes, substitutions, and alterations can be made to input power estimator without departing from the spirit and scope of the invention in its broadest form. In addition, other embodiments capable of providing the advantages as described hereinabove are well within the broad scope of the present invention. While the input power estimator and method have been described as providing advantages in the environment of a power converter, other power processing circuits and applications therefor such as an input power estimator for a power conversion arrangement for a motor or other electromechanical device are well within the broad scope of the present invention.

For a better understanding of power electronics, see "Principles of Power Electronics," by J. G. Kassakian, M. F. Schlecht and G. C. Verghese, Addison-Wesley (1991), and "Power Electronics," by Ned Mohan, Tore M. Undeland, William P. Robbins, John Wiley & Sons, for details in power electronics and closed-loop control design for power electronics converters, and the Designer Reference Manual from Freescale Semiconductor, Inc., entitled "Design of a Digital AC/DC SMPS Using the 56F8323 Device," for using digital control for power electronic applications. The aforementioned references are incorporated herein by reference.

Also, although the present invention and its advantages have been described in detail, it should be understood that various changes, substitutions and alterations can be made herein without departing from the spirit and scope of the invention as defined by the appended claims. For example, the input power estimators discussed hereinabove can be implemented in different methodologies and replaced by other processes, or a combination thereof, to form the devices providing input power estimation for a power converter as described herein.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A controller for use with a power processing circuit, comprising:
   a voltage loop compensator configured to produce a voltage compensation signal as a function of an output voltage of said power processing circuit; and
   an input power estimator configured to produce an input power estimate of an input power to said power processing circuit as a function of a linear relationship with a constant offset in accordance with said voltage compensation signal.

2. The controller as recited in claim 1 wherein said linear relationship to produce said input power estimate is dependent on at least one of an input voltage and an operating temperature of said power processing circuit.

3. The controller as recited in claim 1 wherein said input power estimator comprises a digital circuit.

4. The controller as recited in claim 3 wherein said output voltage is a scaled, digitized output voltage subtracted from a reference output voltage.

5. The controller as recited in claim 1 wherein said input power estimate is provided to an external system through a communications means.

6. The controller as recited in claim 1 further comprising a pulse width modulator configured to produce a signal to control a duty cycle of a boost power switch in a boost power stage of said power processing circuit.

7. The controller as recited in claim 1 wherein said voltage loop compensator produces said voltage compensation signal as a function of a first error signal derived from a scaled, digitized output voltage subtracted from a reference output voltage, said controller, further comprising:
   a multiplier configured to produce a time-dependent current reference signal as a function of a voltage feedforward signal derived from a scaled, digitized input voltage of said power processing circuit via a feedback circuit and said voltage compensation signal;
   a summer configured to produce a second error signal as a function of a current feedback signal derived from a scaled, digitized inductor current of a boost power stage of said power processing circuit and said time-dependent current reference signal;
   a current loop compensator configured to produce a current compensation signal from said second error signal; and
   a pulse width modulator configured to produce a signal to control a duty cycle of a boost power switch in said boost power stage of said power processing circuit as a function of said current compensation signal.

8. A method of operating a controller of a power processing circuit, comprising:
   producing a voltage compensation signal as a function of an output voltage of said power processing circuit with a voltage loop compensator; and producing an input power estimate of an input power to said power processing circuit as a function of a linear relationship with a constant offset in accordance with said voltage compensation signal with an input power estimator.

9. The method as recited in claim 8 wherein said linear relationship to produce said input power estimate is dependent on at least one of an input voltage and an operating temperature of said power processing circuit.

10. The method as recited in claim 8 wherein said input power estimator comprises a digital circuit.

11. The method as recited in claim 8 wherein said output voltage is a scaled, digitized output voltage subtracted from a reference output voltage.

12. The method as recited in claim 8 wherein said input power estimate is provided to an external system through a communications means.

13. The method as recited in claim 8 further comprising producing a signal to control a duty cycle of a boost power switch in a boost power stage of said power processing circuit.

14. The method as recited in claim 8 wherein said voltage loop compensator produces said voltage compensation signal as a function of a first error signal derived from a scaled, digitized output voltage subtracted from a reference output voltage, said method, further comprising:
producing a time-dependent current reference signal as a function of a voltage feed-forward signal derived from a scaled, digitized input voltage of said power processing circuit and said voltage compensation signal;
producing a second error signal as a function of a current feedback signal derived from a scaled, digitized inductor current of a boost power stage of said power processing circuit and said time-dependent current reference signal;
producing a current compensation signal from said second error signal; and
producing a signal to control a duty cycle of a boost power switch in said boost power stage of said power processing circuit as a function of said current compensation signal.

15. A power converter, comprising:
a boost power stage including a boost power switch configured to receive an input power with an input current and input voltage and produce an output voltage; and
a controller, including:
a voltage loop compensator configured to produce a voltage compensation signal as a function of said output voltage, and
an input power estimator configured to produce an input power estimate of said input power as a function of a linear relationship with a constant offset in accordance with said voltage compensation signal.

16. The power converter as recited in claim 15 wherein said linear relationship to produce said input power estimate is dependent on at least one of an input voltage and an operating temperature of said power converter.

17. The power converter as recited in claim 15 wherein said input power estimator comprises a digital circuit.

18. The power converter as recited in claim 15 wherein said output voltage is a scaled, digitized output voltage subtracted from a reference output voltage.

19. The power converter as recited in claim 15 wherein said input power estimate is provided to an external system through a communications means.

20. The power converter as recited in claim 15 wherein voltage loop compensator produces said voltage compensation signal as a function of a first error signal derived from a scaled, digitized output voltage subtracted from a reference output voltage, said controller, further including:
a multiplier configured to produce a time-dependent current reference signal as a function of a voltage feed-forward signal derived from a scaled, digitized input voltage via a feedback circuit and said voltage compensation signal'
a summer configured to produce a second error signal as a function of a current feedback signal derived from a scaled, digitized inductor current of said boost power stage and said time-dependent current reference signal;
a current loop compensator configured to produce a current compensation signal from said second error signal; and
a pulse width modulator configured to produce a signal to control a duty cycle of said boost power switch as a function of said current compensation signal.

* * * * *